(12) United States Patent
Pyeon

(10) Patent No.: US 8,131,913 B2
(45) Date of Patent: Mar. 6, 2012

(54) SELECTIVE BROADCASTING OF DATA IN SERIES CONNECTED DEVICES

(75) Inventor: Hong Beom Pyeon, Kanata (CA)

(73) Assignee: MOSAID Technologies Incorporated, Ottawa, Ontario (CA)

(*) Notice: Subject to any disclaimer, the term of this patent is extended or adjusted under 35 U.S.C. 154(b) by 680 days.

(21) Appl. No.: 12/254,315

(22) Filed: Oct. 20, 2008

(65) Prior Publication Data

US 2009/0198857 A1 Aug. 6, 2009

Related U.S. Application Data

(60) Provisional application No. 61/025,916, filed on Feb. 4, 2008.

(51) Int. Cl.
*G06F 12/02* (2006.01)

(52) U.S. Cl. ............ 711/103; 711/154; 711/200; 711/5; 711/E12.034

(58) Field of Classification Search .................. 711/103, 711/154, 200, 5, E12.001
See application file for complete search history.

(56) References Cited

U.S. PATENT DOCUMENTS

| | | | | |
|---|---|---|---|---|
| 5,357,621 A | * | 10/1994 | Cox | ............................... 711/172 |
| 5,404,460 A | | 4/1995 | Thomsen et al. | |
| 5,860,080 A | | 1/1999 | James | |
| 6,094,713 A | * | 7/2000 | Khadder et al. | ............... 711/210 |
| 6,130,881 A | * | 10/2000 | Stiller et al. | .................... 370/238 |
| 6,826,621 B1 | * | 11/2004 | Kephart et al. | ............... 709/238 |
| 6,928,501 B2 | | 8/2005 | Andreas et al. | |
| 6,944,697 B2 | * | 9/2005 | Andreas | ......................... 710/110 |
| 7,068,545 B1 | * | 6/2006 | Kimelman et al. | ...... 365/189.16 |
| 7,072,994 B2 | | 7/2006 | Britton | |
| 7,130,958 B2 | | 10/2006 | Chou et al. | |
| 7,210,634 B2 | | 5/2007 | Sapiro | |
| 7,308,524 B2 | | 12/2007 | Grundy et al. | |
| 2004/0148482 A1 | | 7/2004 | Grundy | |
| 2004/0230718 A1 | | 11/2004 | Polzin et al. | |
| 2006/0031593 A1 | * | 2/2006 | Sinclair | .......................... 709/251 |
| 2006/0285395 A1 | | 12/2006 | Booth | |
| 2007/0233917 A1 | | 10/2007 | Pyeon et al. | |
| 2007/0234071 A1 | | 10/2007 | Pyeon | |

OTHER PUBLICATIONS

Siegel, Howard Jay; , "Analysis Techniques for SIMD Machine Interconnection Networks and the Effects of Processor Address Masks," Computers, IEEE Transactions on , vol. C-26, No. 2, pp. 153-161, Feb. 1977.*
PCT International Patent Application No. PCT/CA2009/000156 International Search Report dated Jul. 7, 2009, p. 2.

* cited by examiner

*Primary Examiner* — Edward Dudek, Jr
*Assistant Examiner* — Ralph A Verderamo, III
(74) *Attorney, Agent, or Firm* — Shin Hung; Borden Ladner Gervais LLP

(57) ABSTRACT

A method and system for the selective broadcasting of commands to a subset of a plurality of devices connected in series to a memory controller, where each of the plurality of devices has a unique identification number (ID). The memory controller designates the subset of devices to execute the command, excluding the non-selected devices from executing the command. The memory controller encodes the ID numbers of the designated devices into a single coded address, and sends the command along with the coded address in a packet to the series connected devices. Each device receives the packet in a serial bitstream and decodes the coded address using its ID number in order to determine whether it is selected or not. If the device is selected, the command is executed. Otherwise, the packet is forwarded without executing the command.

35 Claims, 15 Drawing Sheets

|  | Mask |
|---|---|
|  | 0 0 1 1 |
| 0 1 0 0 | 0 1 1 1 |
| 0 1 0 1 | 0 1 1 1 |
| 0 1 1 0 | 0 1 1 1 |
| 0 1 1 1 | 0 1 1 1 |

Addresses (label for left column)

FIG. 11

SELECTIVE BROADCASTING OF DATA IN SERIES CONNECTED DEVICES

CROSS REFERENCE TO RELATED APPLICATIONS

This application claims the benefit of priority of U.S. Provisional Patent Application No. 61/025,916 filed Feb. 4, 2008, which is incorporated herein by reference in its entirety.

FIELD OF THE INVENTION

The present invention relates generally to a system of memory devices connected in series in a ring topology with a memory controller. More particularly, the present invention relates to selecting memory devices in a system of memory devices connected in series in a ring topology with a memory controller.

BACKGROUND OF THE INVENTION

Flash memory is a commonly used type of non-volatile memory in widespread use as mass storage for consumer electronics, such as digital cameras and portable digital music players for example. The density of a presently available Flash memory component, consisting of 2 stacked dies, can be up to 32 Gbits (4 GB), which is suitable for use in popular USB Flash drives, since the size of one Flash component is typically small.

The advent of 8 mega pixel digital cameras, portable digital entertainment devices with music and video capabilities, and solid state hard disk drives has spurred demand for ultra-high capacities to store the large amounts of data, which may not be met by the single Flash memory device. Therefore, multiple Flash memory devices are combined together into a system to effectively increase the available storage capacity. For example, flash storage densities of 20 GB or higher may be required for such applications.

FIG. 1 is a block diagram of a prior art system 10 integrated with a host system 12. The prior art system 10 includes a memory controller 14 in communication with host system 12, and multiple non-volatile memory devices 16. The host system 12 includes a processing device such as a microcontroller, microprocessor, or a computer system. The prior art system 10 of FIG. 1 is organized to include one channel 18, with the memory devices 16 being connected in parallel to channel 18. Those skilled in the art should understand that the prior art system 10 can have more or fewer than four memory devices connected to it.

Channel 18 includes a set of common buses, which include data and control lines that are connected to all of its corresponding memory devices. Each memory device is enabled or disabled with respective chip select (enable) signals CE1#, CE2#, CE3# and CE4#, provided by memory controller 14. The "#" indicates that the signal is an active low logic level signal. At most one of the chip select signals is selected at one time for enabling one of the memory devices 16 during an operation. The memory controller 14 is responsible for issuing commands and data, via the channel 18, to a selected memory device in response to the operation of the host system 12. Read data output from the memory devices is transferred via the channel 18 back to the memory controller 14 and host system 12. Operation of the prior art system 10 can be asynchronous or synchronous. FIG. 1 illustrates an example of a synchronous system that uses a clock (CK), which is provided in parallel to each memory device 16 to synchronize data transfer on the channel 18. The prior art system 10 is generally said to include a multi-drop bus, in which the memory devices 16 are connected in parallel with respect to channel 18.

There are specific issues that can adversely impact performance of the system. The structure of the prior art system 10 imposes physical performance limitations. There is a large number of parallel signals extending across the system, and the signal integrity of the signals they carry may be degraded by crosstalk, signal skew, input & output loading effect, and simultaneous switching noise (SSN). Input/output power consumption in such a system becomes an issue as each signal track between the flash controller and flash memory devices is frequently charged and discharged for signalling. With increasing system clock frequencies, the power consumption will increase.

There is also a practical limit to the number of memory devices which can be connected in parallel to the channel since the drive capability of a single memory device is small relative to the loading of the long signal tracks. Furthermore, as the number of memory devices increase, more chip enable signals (CE#) are required, and CK may need to be routed to the additional memory devices, all of which are longer as they are routed to the memory devices. Clock performance issues due to extensive clock distribution are well known in the art, become an issue in large Prior Art systems with many memory devices 16. Therefore, for a Prior Art memory system to include a large number of memory devices, either the memory devices are spread across multiple channels or the frequency operation of the memory system would be limited; either option involves compromises. A controller having multiple channels and additional chip enable signals increases the cost of the system. Otherwise, the system is limited to a small number of memory devices.

Therefore, the memory system 10 of FIG. 1 would not be suitable as a solid-state disk drive, since its density will be limited and its performance will bottle-neck performance of the host system 12. Additionally, there may be applications where data integrity is of paramount importance. One technique for ensuring data integrity is to duplicate it at a different location, so that the corrupted data can be reconstructed or replaced. In the memory system of FIG. 1 for example, this would be done by writing the same data to two different memory devices 16. However, due to its density limitation too much memory would be used to store the duplicate data, since the overall density of the memory system is effectively reduced by one half. Therefore the memory system can quickly reach its maximum storage capacity.

It is, therefore, desirable to provide a high density and high performance memory system which can selectively enable multiple memory devices for executing the same command, with minimal time overhead.

SUMMARY OF THE INVENTION

It is an object of the present invention to provide a circuit and method for allowing a subset of a plurality of devices to execute the same command that is provided in one data packet.

In a first aspect, there is provided a method for selecting a subset of devices of a plurality of devices serial-connected to a memory controller to execute a command. The method includes encoding identification (ID) numbers of each of the subset of devices for providing code information; providing a command packet including an op code and the code information to each of the plurality of devices; decoding the code information received by each of the plurality of devices, and executing the op code if an ID number stored in the device is encoded in the received code information. In one embodiment, the memory controller provides $2^x$ of the ID numbers, where x is an integer greater than zero.

In another embodiment, each of the ID numbers is N-bits in length, and the code information includes a Target ID number N-bits in length and a mask code N-bits in length, where N is an integer value greater than 0. In the presently described embodiment, the step of encoding includes selecting one ID number of the subset of devices as the Target ID number; comparing the ID numbers of each of the subset of devices with the Target ID number for generating corresponding coded ID numbers; and logically combining a bit in the same bit position from each of the coded ID numbers for generating one bit having the corresponding bit position in the mask code. There can be M ID numbers corresponding to the subset of devices, where M is an integer value greater than 0. Furthermore, the step of comparing includes outputting the comparison results in an M*N matrix, and transposing the M*N matrix into an N*M matrix, where one bit is generated by executing a logical function upon the comparison results in one of the N rows of the N*M matrix. A first bit of the mask code generated from the first row of the N*M matrix represents a most significant bit of the mask code, and a last bit of the mask code generated from the last row of the N*M matrix represents a least significant bit of the mask code. In a variation of the present embodiment, the step of comparing comprises a step of executing an XNOR function between the ID numbers of each of the subset of devices with the Target ID number. Furthermore, the step of logically combining can comprise a step of executing a NAND function between bits in the same bit position from each of the coded ID numbers.

In an aspect of the present embodiment, the step of decoding comprises a step of processing the ID number stored in the device with the Target ID number and the mask code to provide an indication that all bit positions of the ID number stored in the device are encoded in the mask code. The step of processing includes comparing bits of each bit position of the ID number stored in the device with the corresponding bits of each corresponding bit position of the Target ID number for generating a coded target ID number; adding the mask code to the coded target ID number for providing a modified coded target ID number; and multiplying the bits of the modified coded target ID number with each other to provide the indication that all bit positions of the ID number stored in the device are encoded in the mask. The step of comparing the bits of each bit position of the ID number stored in the device can comprise a step of executing an XNOR logic function; the step of adding the mask code to the coded target ID number can comprise a step of executing an OR logic function; and the step of multiplying the bits of the modified coded target ID number can comprise a step of executing an AND logic function.

In another embodiment of the present aspect, the step of providing the command packet comprises steps where each of the plurality of devices receives the command packet from one of a previous device and the memory controller, and passes the command packet to one of a subsequent device and the memory controller, where the previous device and the subsequent device include memory devices. A further step includes inhibiting the command packet from being passed to one of the subsequent device and the memory controller when the last device of the subset of devices decodes the code information. The step of inhibiting comprises logically combining the Target ID number, the mask code and the ID number stored in the device to provide a last device signal; and setting an output buffer to a null value in response to the last device signal. The step of logically combining can include adding the Target ID number to the mask code to obtain a last designated device address; and comparing the last designated device address to the ID number stored in the device, where the last device signal is generated when the last designated device address matches the ID number stored in the device. Furthermore, the step of setting comprises a step of coupling an input of the output buffer to a static logic level in response to the last device signal.

In a second aspect, there is provided a device having a device identification (ID) number for receiving a command packet. The device includes a data flow-through path, a command interpreter and an ID processor. The data flow-through path receives the command packet at an input port and passes the command packet to an output port. The command packet includes an op code and code information corresponding to a subset of device ID numbers selected for executing the op code. The command interpreter is selectively enabled for decoding the op code. The ID processor receives the code information and decodes the code information for enabling the command interpreter if the device ID number is encoded in the code information. In an embodiment of the present aspect, the data flow-through path includes an input buffer coupled to the input port for buffering the command packet, and an output buffer coupled to the input buffer for receiving the command packet and for driving the command packet onto the output port. The code information can include a mask code and a Target ID number. The ID processor can include an ID match decoder for logically combining the mask code, the Target ID number and the device ID for providing a match signal when the device ID number is encoded in the mask code. The Target ID number is one of the subset of device ID numbers.

In another embodiment of the present aspect, the ID match decoder includes a comparator, an adder and a multiplier. The comparator compares each bit of the device ID number with a corresponding bit of the Target ID number to provide a coded Target ID number. The adder adds each bit of the mask code to a corresponding bit of the coded Target ID number to provide a modified coded target ID number. The multiplier provides the match signal when all bits of the modified coded target ID number are at an active logic level. In the present embodiment, the comparator includes XNOR logic gates, where each XNOR logic gate compares one bit of the device ID number with a corresponding bit of the Target ID number. The adder can include OR logic gates, where each OR logic gate adds one bit of the mask code to a corresponding bit of the coded Target ID number. The multiplier can include an AND logic circuit for receiving all bits of the modified coded target ID number.

In yet another embodiment of the present aspect, the ID processor includes an output inhibiting circuit for inhibiting the command packet from being driven onto the output port. The output inhibiting circuit can include an adder and a last ID decoder. The adder adds the mask code to the Target ID number to provide a last device ID number of the subset of device ID numbers. The last ID decoder compares the device ID number to the last device ID number, and provides a last ID control signal when the device ID number matches the last device ID number. The output buffer is disabled in response to the last ID control signal, and the data flow-through path includes a selector for selectively passing one of the command packet and a null value to the output buffer. The selector passes the null value in response to the last ID control signal, where the null value corresponds to a bit stored in an output data register coupled to the selector.

In a third aspect, there is provided a memory system including a memory controller and a plurality of serial-connected memory devices in a ring topology with the memory controller. The memory controller issues a command packet including an op code and code information corresponding to a subset of device identification (ID) numbers selected for executing the op code. Each of the plurality of memory devices has a unique device ID number and receives the command packet and executes the op code if the unique device ID number is encoded in the code information. In an embodiment of the present aspect, each of the plurality of memory devices includes a data flow-through path, a command interpreter and an ID processor. The data flow-through path receives the command packet at an input port and passes the command packet to an output port. The command interpreter is selectively enabled for decoding the op code. The ID processor receives the code information and decodes the code information for enabling the command interpreter when the unique device ID number is encoded in the code information. The code information comprises a mask code and a Target ID number. The ID processor includes an ID match decoder for logically combining the mask code, the Target ID number and the device ID number to provide a match signal when the unique device ID number is encoded in the mask code. The ID processor comprises an output inhibiting circuit for inhibiting the command packet from being driven onto the output port when the unique device ID number matches a last device ID number of the subset of device ID numbers.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 11 is a matrix illustrating a logical OR'ing of selected addresses with the mask code;

DETAILED DESCRIPTION

The embodiments of the invention provides a method and system for the selective broadcasting of commands to a subset of a plurality of devices in a system, where a command can include any combination of an operation code, device address, write data and memory array address. The memory system includes memory devices and a memory controller connected in series in a ring topology arrangement. The embodiments of the invention are aimed at selecting multiple devices to execute a command without having all the devices in the memory system execute the same command.

Figure 1:
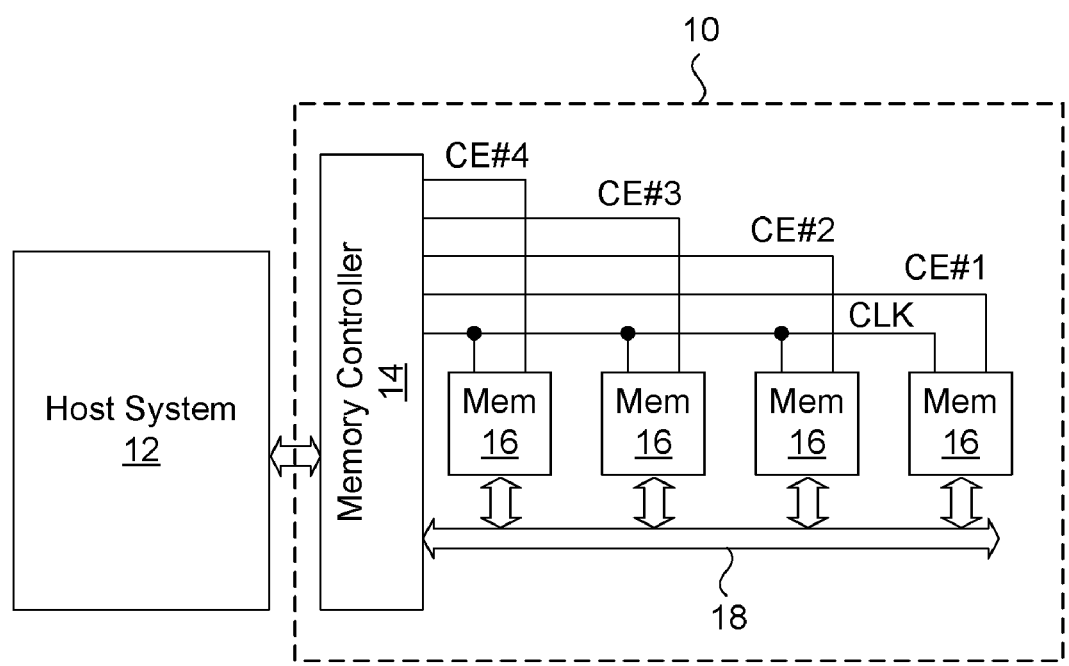
FIG. 1 is a block diagram of a prior art system integrated with a host system.
Figure 2A:
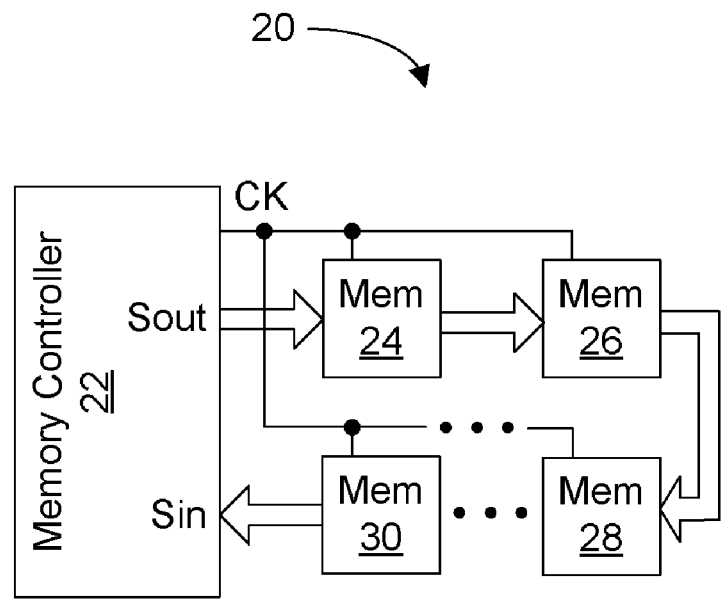
FIG. 2A is a block diagram of a system receiving a parallel clock signal.
Figure 2B:
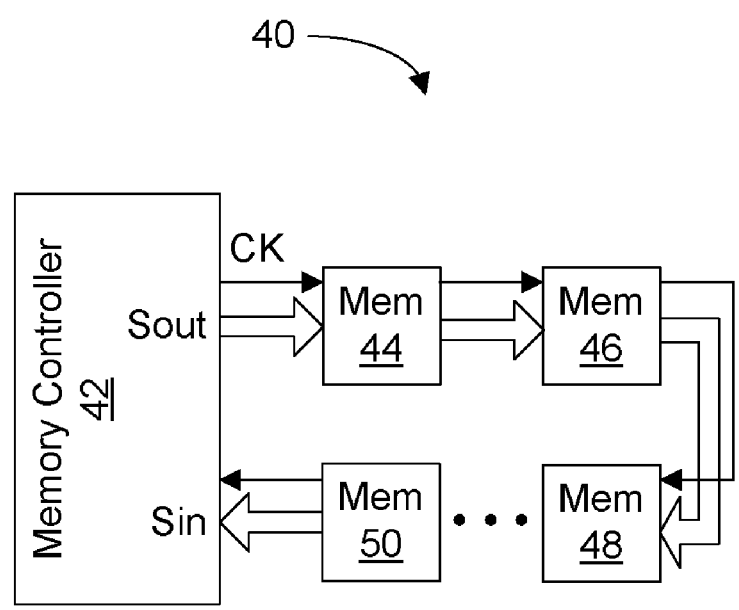
FIG. 2B is a block diagram of the same system of FIG. 2A receiving a source synchronous clock signal.

A system that resolves many performance issues of the prior art system 10 of FIG. 1 is a system of serial-connected memory devices connected with the memory controller in a ring topology configuration. FIGS. 2A and 2B are block diagrams illustrating the conceptual nature of a system according to the presently described embodiments. FIG. 2A is a block diagram of a system receiving a parallel clock signal while FIG. 2B is a block diagram of the same system of FIG. 2A receiving a source synchronous clock signal. The clock signal can be either a single ended clock signal or a differential clock pair.

In FIG. 2A, the system 20 includes a memory controller 22 having at least one output port Sout and an input port Sin, and memory devices 24, 26, 28 and 30 that are connected in series. While not shown in FIG. 2A, each memory device has an Sin input port and an Sout output port. Input and output ports consist of one or more physical pins or connections interfacing the memory device to the system it is a part of. In one embodiment, the memory devices can be flash memory devices. Alternately, the memory devices can be DRAM, SRAM or any other type of memory device provided it has an input/output interface compatible with a specific command structure, for executing commands or for passing through commands and data to the next memory device. The current example of FIG. 2A includes four memory devices, but alternate embodiments can include a single memory device, or any suitable number of memory devices. Accordingly, if memory device 24 is the first device of the system 20 as it is connected to Sout, then memory device 30 is the Nth or last device as it is connected to Sin, where N is an integer number greater than zero. Memory devices 26 to 28 are then intervening serial-connected memory devices between the first and last memory devices.

Each memory device can assume a distinct identification (ID) number, or device address (DA) upon power up initialization of the system, so that they are individually addressable. Commonly owned U.S. patent application Ser. No. 11/622,828 titled "APPARATUS AND METHOD FOR PRODUCING IDS FOR INTERCONNECTED DEVICES OF MIXED TYPE", U.S. patent application Ser. No. 11/750, 649 titled "APPARATUS AND METHOD FOR ESTABLISHING DEVICE IDENTIFIERS FOR SERIALLY INTERCONNECTED DEVICES", U.S. patent application Ser. No. 11/692,452 titled "APPARATUS AND METHOD FOR PRODUCING DEVICE IDENTIFIERS FOR SERIALLY INTERCONNECTED DEVICES OF MIXED TYPE", U.S. patent application Ser. No. 11/692,446 titled "APPARATUS AND METHOD FOR PRODUCING IDENTIFIERS REGARDLESS OF MIXED DEVICE TYPE IN A SERIAL INTERCONNECTION", U.S. patent application Ser. No. 11/692,326 titled "APPARATUS AND METHOD FOR IDENTIFYING DEVICE TYPE OF SERIALLY INTERCONNECTED DEVICES", U.S. patent application Ser. No. 11/771,023 titled "ADDRESS ASSIGNMENT AND TYPE RECOGNITION OF SERIALLY INTERCONNECTED MEMORY DEVICES OF MIXED TYPE" and U.S. patent application Ser. No. 11/771,241 titled "SYSTEM AND METHOD OF OPERATING MEMORY DEVICES OF MIXED TYPE" describe methods for generating and assigning device addresses for serial-connected memory devices of a system, the contents of which are incorporated by reference in their entirety.

Memory devices 24 to 30 are considered serial-connected devices because the data input of one memory device is connected to the data output of a previous memory device, thereby forming a series-connection system organization, with the exception of the first and last memory devices in the chain. The channel of memory controller 22 includes data, address, and control information provided by separate pins, or the same pins, connected to conductive lines. The embodiment of FIG. 2A includes one channel, where the one channel includes Sout and corresponding Sin ports. However, memory controller 22 can include any suitable number of channels for accommodating separate memory device chains. In the example of FIG. 2A, the memory controller 22 provides a clock signal CK, which is connected in parallel to all the memory devices.

In general operation, the memory controller 22 issues a command through its Sout port, which includes an operation code (op code), a device address, optional address information for reading or programming, and data for programming. The command may be issued as a serial bitstream command packet, where the packet can be logically subdivided into segments of a predetermined size. Each segment can be one byte in size for example. A bitstream is a sequence or series of bits provided over time. The command is received by the first memory device 24, which compares the device address to its assigned address. If the addresses match, then memory device 24 executes the command. The command is passed through its own output port Sout to the next memory device 26, where the same procedure is repeated. Eventually, the memory device having the matching device address, referred to as a selected memory device, will perform the operation specified by the command. If the command is a read data command, the selected memory device will output the read data through its output port Sout (not shown), which is serially passed through intervening memory devices until it reaches the Sin port of the memory controller 22. Since the commands and data are provided in a serial bitstream, the clock is used by each memory device for clocking in/out the serial bits and for synchronizing internal memory device operations. This clock is used by all the memory devices in the system 20.

Because the clock frequency used in the system according FIG. 2A is relatively low, unterminated full swing CMOS signalling levels can be used to provide robust data communication. This is also referred to as LVTTL signalling, as would be well known to those skilled in the art.

A further performance improvement over the system 20 of FIG. 2A can be obtained by the system of FIG. 2B. System 40 of FIG. 2B is similar to the system 20 of FIG. 2A, except that the clock signal CK is provided serially to each memory device from an alternate memory controller 42 that provides the source synchronous clock signal CK. Each memory device 44, 46, 48 and 50 may receive the source synchronous clock on its clock input port and forward it via its clock output port to the next device in the system. In some examples of the system 40, the clock signal CK is passed from one memory device to another via short signal lines. Therefore none of the clock performance issues related to the parallel clock distribution scheme are present, and CK can operate at high frequencies. Accordingly, the system 40 can operate with greater speed than the system 20 of FIG. 2A. For example, high speed transceiver logic (HSTL) signalling can be used to provide high performance data communication. In the HSTL signalling format, each memory device may receive a reference voltage that is used for determining a logic state of the incoming data signals. Another similar signalling format is the SSTL signalling format. Accordingly, the data and clock input circuits in the memory devices of the systems 20 and 40 are structured differently from each other. Both the HSTL and SSTL signalling formats should be well known to those skilled in the art.

As previously mentioned, the memory devices of FIGS. 2A and 2B have a unique ID (Identification) number or DA (Device Address) so that the memory controller can select one of them when sending the command, so that only the selected memory device executes the command. Accordingly, this memory device selection scheme allows for the selection of only one device at a time whenever a command is issued. The command contains a single ID number or DA, which makes multiple-device selection impossible with this memory device selection scheme. For illustrative purposes, normal operations in the memory systems of FIGS. 2A and 2B involve issuance of commands sequentially when two different operations are to be executed by two different memory devices. Whenever a new command is issued, the data packet may include a new ID number, and a previously selected device is by default unselected. However, if the identical command is to be executed by two different memory devices, the same data packet is issued twice, but with different device ID numbers. Thus, the total operation time of the memory system increases as the same command is issued to more memory devices.

A partial solution for this problem is the broadcasting technique, by which all series-connected memory devices are selected at the same time and an issued command is executed in all devices. As discussed in commonly owned U.S. patent application Ser. No. 12/033,577 filed on Feb. 19, 2008, broadcasting is a technique for simplifying the distribution of common commands to all the memory devices in a system. Without broadcasting, separate commands are issued to each memory device by device address. In the broadcasting technique, a broadcast address replaces the device address (DA) or ID number in the data packet. Each memory device has a register for storing the broadcast address which is preset during manufacturing. Hence, when the data packet is received, each memory device compares the address in the data packet to both its unique device address and its stored broadcast address. The memory device executes the command when its stored broadcast address matches the broadcasting address in the data packet. However, this method does not provide for a multiple selection of devices in part i.e. two memory devices in a memory system having a total of four memory devices. The simultaneous selection of a subset of the memory devices in the memory system can be provided to provide special features for specific applications.

For example, graphics processing may require graphic data to be repeatedly written into multiple memory devices. For data redundancy applications, sensitive data is written into multiple memory devices to back up the write data, thereby securing the data in case of failure in one of the memory devices. According to the present embodiments, a memory system is provided that allows for multiple selection of devices with one data packet in order to reduce the overall processing time relative to individual memory device selection. By selecting multiple memory devices with one data packet, the energy needed for processing a command in more than one device is minimized.

Data sent to serial-connected devices, is encapsulated in a data packet, also referred to as a command packet. Each packet includes at least a header and a data field. The data field includes commands to be executed, and data to be stored in the devices etc. the header includes control information such as the addresses of the designated device. A typical example of the bytes configuration of series connected devices is illustrated in FIG. 3.

Figure 3:
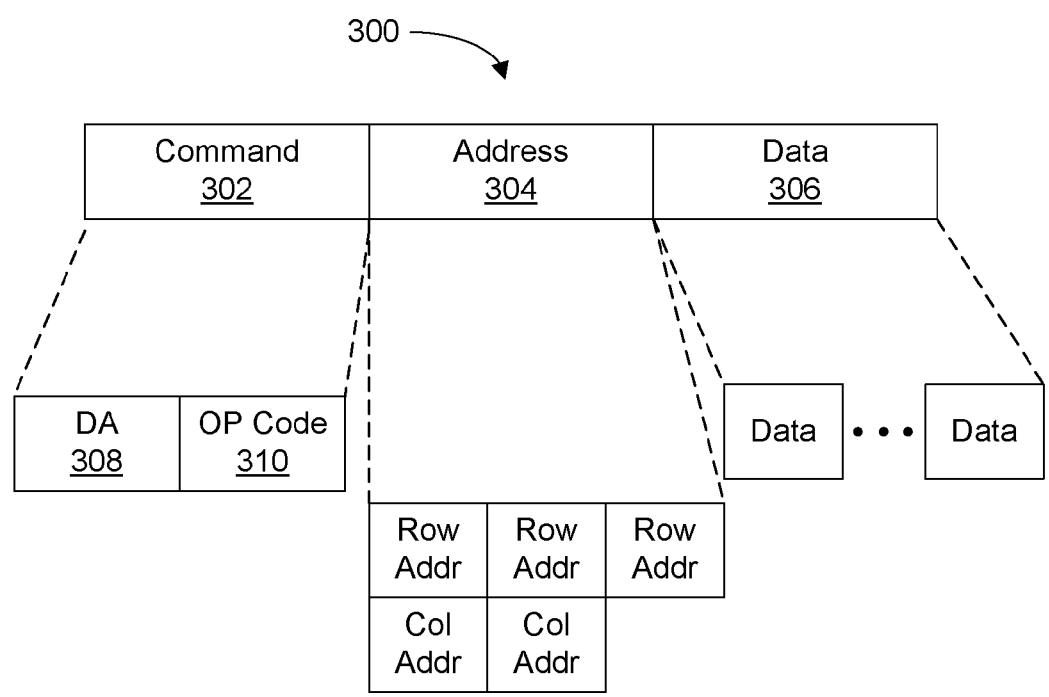
FIG. 3 illustrates the bytes configuration of series connected devices.

The command packet 300 has the structure illustrated in FIG. 3, and includes three fields, two of which are optional depending on the specific command being issued by the memory controller. The first field, being a mandatory field, is the command field 302. The first optional field is an address field 304, and the second optional field is a data field 306.

The command field 302 includes two sub-fields, the first being a device address (DA) field 308 and the second being an op code field 310. The device address field 308 can be considered a header of the command packet 300, and can be any suitable number of bits in length, and is used for addressing each memory device in the system. For example, a device address field 308 of 1 byte (8 bits) in length is sufficient for addressing up to 256 ($2^8$) memory devices, however the device address field 308 can be any desired length. One address can be reserved for addressing all memory devices simultaneously, i.e. for broadcasting an operation. In an alternate embodiment, the device address field 308 can include a device type field to indicate the type of memory device the op code field 310 is directed to. For example, the device type field can designate a DRAM, SRAM or flash memories. The op code field 310 can be any suitable number of bits in length to represent the commands for any suitable number of memory devices, and can include a bank address. For example, the flash memory command set will have different commands than a DRAM command set in view of inherent differences, hence the op code field is assigned to functions accommodate all possible commands from both command sets if the system includes both types of memory devices.

However, a preferred alternative for dealing with different types of memories is to have the op code space divided into two collections of commands: those commands related to ring operation and those related to memory array operations. The former set can be consistent across all memory types, but the second group need not be. The semantics of the op codes in this group would be memory type specific. For example, a particular op code that meant program when issued to a Flash memory might mean refresh when presented to a DRAM. Since the memory controller must know what kind of memory is at each assigned device address, it does not matter if these functions share the same op code. The address field 304 is used for providing either a row address (Row Addr) or a column address (Col Addr) or a full address of a memory array, depending on the type of operation specified by the op code. The data field 306 will include any suitable number of bits of data to be written or programmed to the memory device. Therefore, the command packets 300 will vary in size since write data may not be required for a particular operation and both addresses and write data may not be required for a particular operation.

Figure 4:
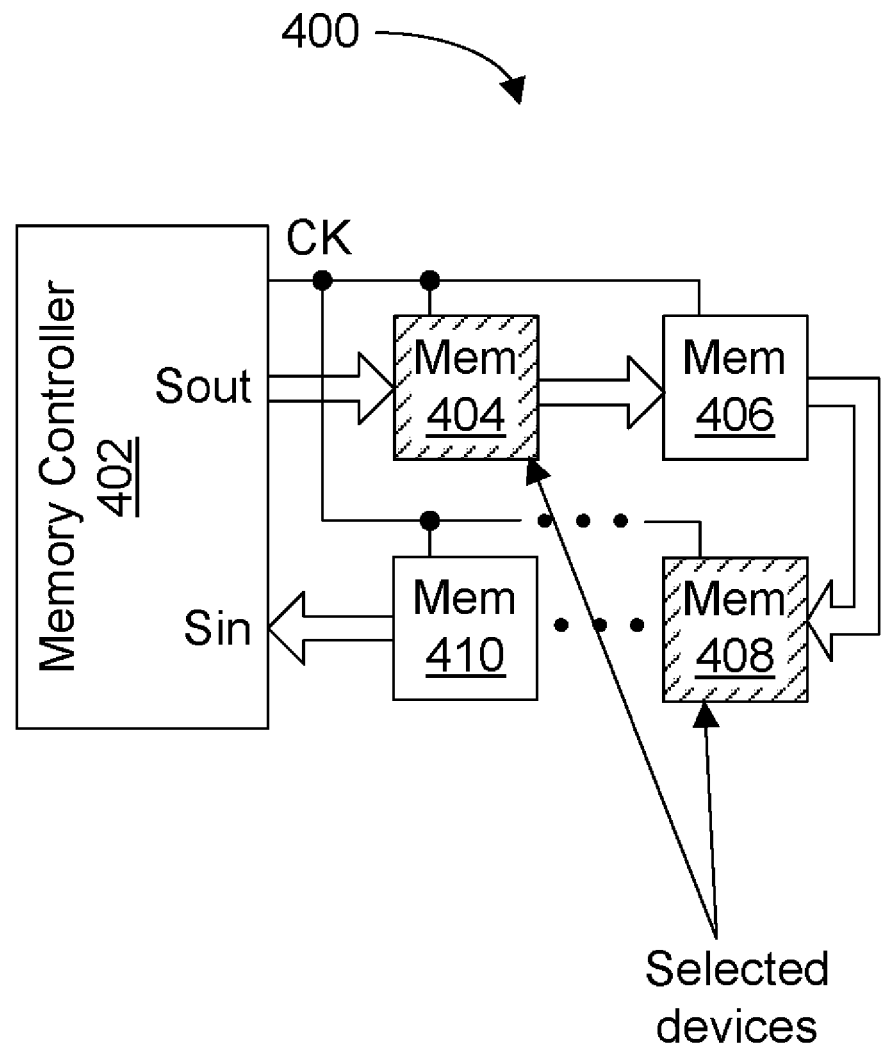
FIG. 4 illustrates a system in accordance with an embodiment of the present invention.

FIG. 4 illustrates a system 400 in accordance with an embodiment of the present invention. The system 400 includes a memory controller 402 and a plurality of serial-connected devices 404, 406, 408 and 410. As described earlier, the memory controller 402 issues a command through its Sout port, which includes an operation code (op code), a device address, optional address information for reading or programming and data for programming. Generally, the memory controller 402 computes code information used for selecting only a subset of the memory devices in the system 400. This code information is included in the command packet that is issued to all the memory devices. Each memory device then decodes the code information in order to determine if it is selected for responding to the other fields of the received command packet. For example, according to the present embodiment, it is possible to simultaneously select devices 404 and 408 to execute a certain command, and exclude devices 406 and 410 and the remaining devices (that are not shown) from doing the same.

Figure 5:
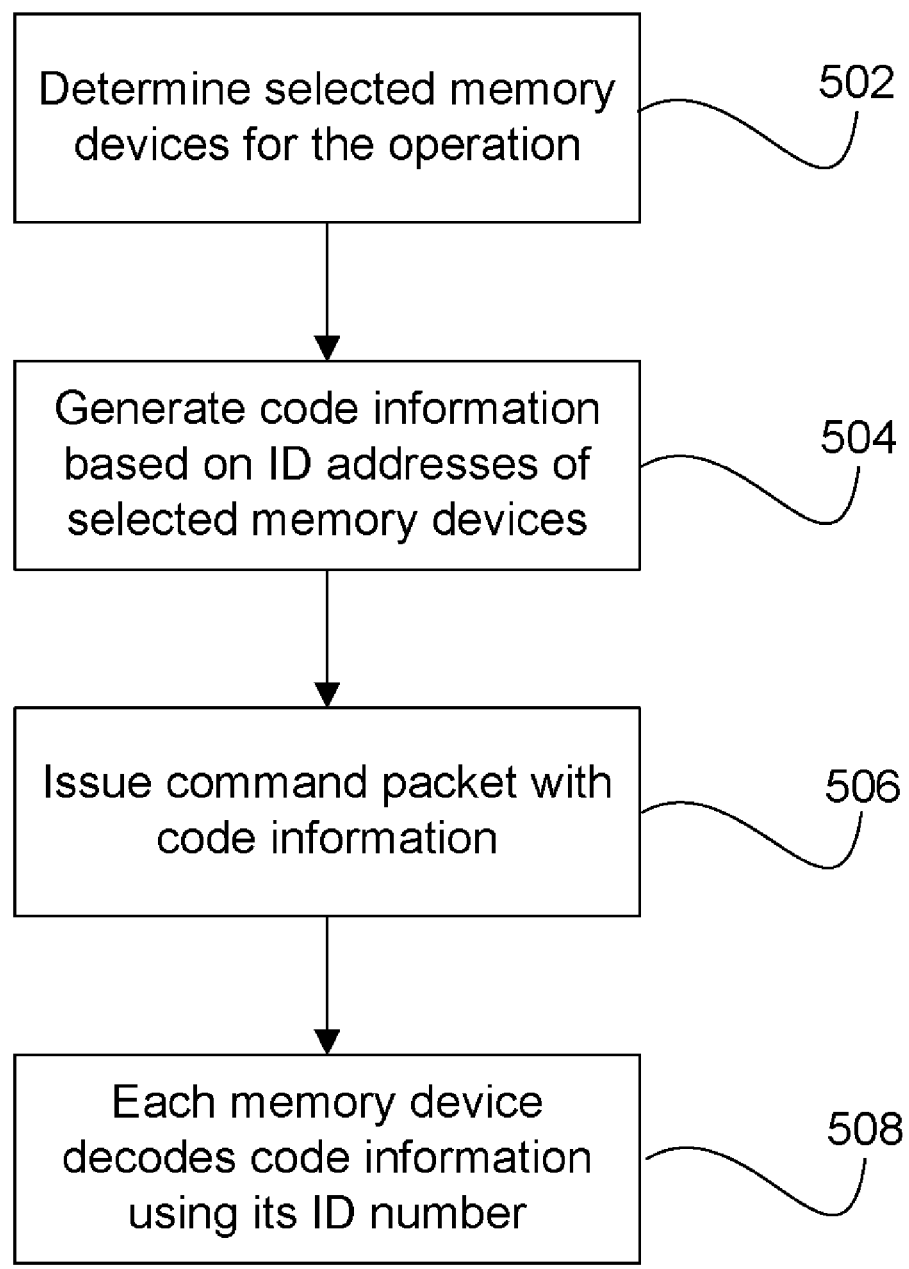
FIG. 5 is a flow chart illustrating how the memory system selects more than one memory device using a single command packet.

FIG. 5 is a flow chart illustrating how the memory system of the present embodiment selects more than one memory device using a single command packet. In step 502 the memory controller determines a number of memory devices to execute a certain command. In step 504 the memory controller generates code information based on the ID addresses of the selected memory devices. In step 506, the memory controller issues a command packet including the command to be executed and the code information that identifies the selected devices. In step 508, each memory device receives the command packet, and decodes the code information to determine if it is selected for responding to the other fields of the received command packet.

Figure 6:
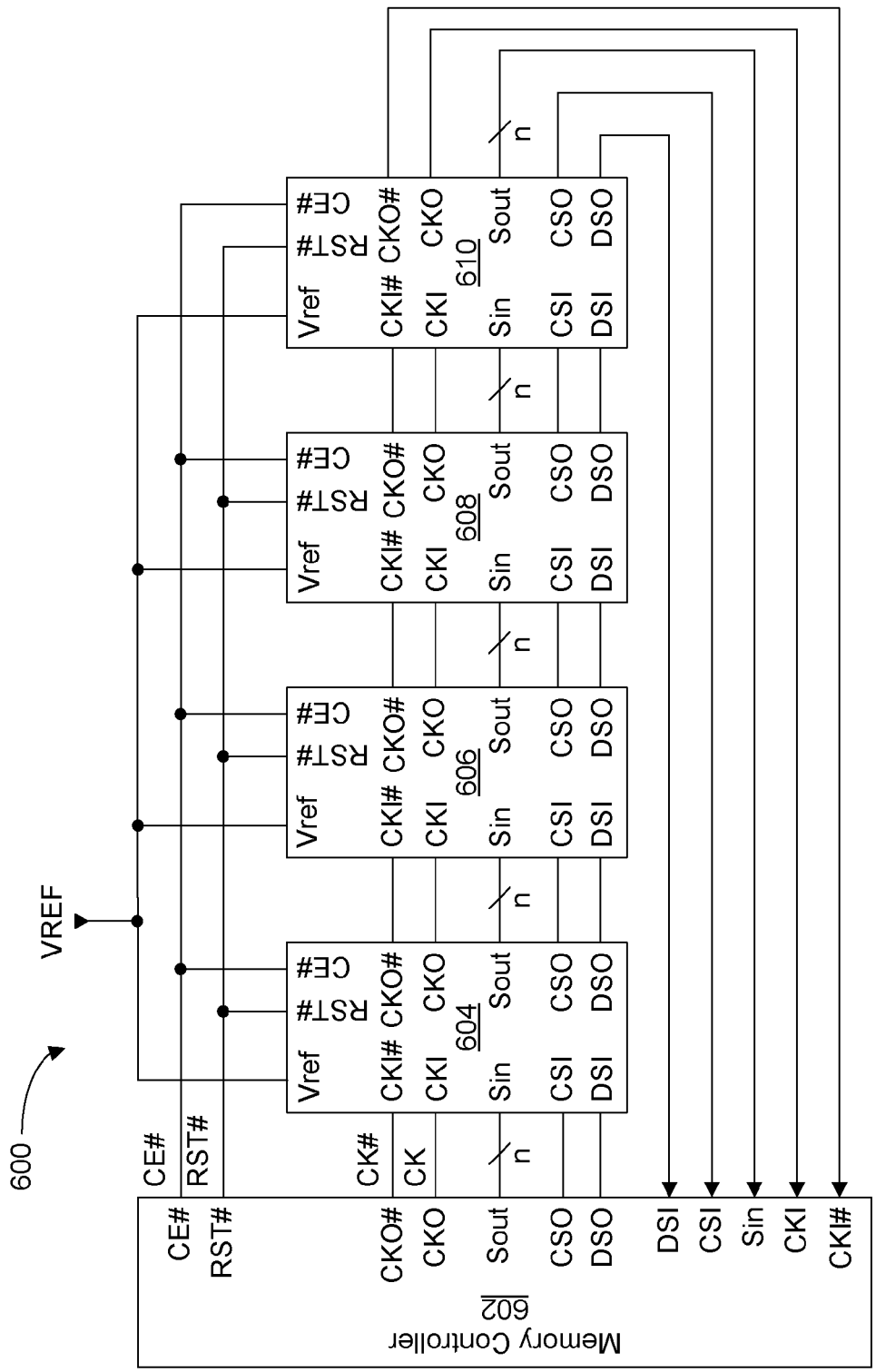
FIG. 6 is a block diagram of a memory system according to an embodiment of the present invention.

FIG. 6 is a block diagram of a memory system according to an embodiment of the present invention. While FIG. 4 is a generic block diagram illustrating the general concept of multiple device selection, this embodiment shows details of the signals propagated between the memory devices and the memory controller. The memory system 600 includes a memory controller 602 and four serial-connected memory devices 604, 606, 608 and 610 connected with each other in a ring topology configuration. The memory controller 602 issues command packets with the code information, and each of the memory devices can decode the code information and determined if it should respond to the command packet. The memory controller 602 provides control signals in parallel to the memory devices. These include the chip enable signal CE# and the reset signal RST#. In one example use of CE#, the devices are enabled when CE# is at the low logic level. In devices of the prior art, once a Flash memory device starts a program or erase operation, CE# can be de-asserted, or driven to a high logic level. However in the present embodiment, de-asserting CE# has the effect of disabling communication from Sin to Sout of the disabled serial-connected memory device. Since the memory devices are connected in a ring, disabling any of the devices breaks communication around the ring and the memory controller becomes unable to communicate with all of the memory devices in the memory system. As a result, CE# is a common signal to all the serial-connected memory devices, and is used to put the entire memory into a low power state. In one example use of RST#, the memory device is set to a reset mode when RST# is at the low logic level. In the reset mode, the power is allowed to stabilize and the device prepares itself for operation by initializing all finite state machines and resetting any configuration and status registers to their default states. The memory controller 602 includes clock output ports CKO# and CKO for providing complementary clock signals CK and CK#, and clock input ports CKI# and CKI for receiving the complementary clock signals from the last memory device of the system. Each memory device may include a clock synthesizer, such as a DLL or a PLL for generating phases of the received clocks. Certain phases are used to center the clock edges within the input data valid window internally to ensure reliable operation. Each memory device has clock output ports CKO# and CKO for passing the complementary clock signals to the clock input ports of the next memory device, and clock input ports CKI and CKI# for receiving the complementary clock signals from either the memory controller 602 or a previous memory device. The last memory device 610 provides the clock signals back to the memory controller 602.

The channel of memory controller 602 includes data output port Sout, data input port Sin, a command strobe input CSI, a command strobe output CSO (echo of CSI), data strobe input DSI, and a data strobe output DSO (echo of DSI). Output port Sout and input port Sin can be one bit in width, or n bits in width where n is a positive integer, depending on the characteristics of the memory controller. For example, if n is 1 then one byte of data is received after eight data latching edges of the clock. A data latching clock edge can be a rising clock edge for example in single data rate (SDR) operation, or both rising and falling edges of the clock for example in double data rate (DDR) operation. If n is 2 then one byte of data is received after four latching edges of the clock. If n is 4 then one byte of data is received after two latching edges of the clock. The memory device can be statically configured or dynamically configured for any width of Sout and Sin. Hence, in a configuration where n is greater than 1, the memory controller provides data in parallel bitstreams. CSI is used for controlling or enabling the latching command data appearing on the input port Sin, and has a pulse duration for delimiting the time when a command is present on the data input port Sin. More specifically, the command data will have a duration measured by a number of clock cycles, and the pulse duration of the CSI signal will have a corresponding duration. DSI is used for enabling the output port Sout buffer of a selected memory device to output read data, and has a pulse duration for delimiting read data provided from its data output port Sout so that the memory controller knows when to latch data on its return from the last memory device.

Since the presently described embodiment of FIG. 6 is intended for high speed operation, a high speed signalling format, such as the HSTL signalling format for example, is used. Accordingly, a reference voltage VREF is provided to each memory device which is used by each memory device to determine the logic level of the signals received at the Sin, CSI and DSI input ports. The reference voltage VREF may be generated by another circuit on the printed circuit board, for example, and is set to a predetermined voltage level based on the voltage swing mid-point of the HSTL signal.

In use of the embodiment of FIG. 6, each memory device is positioned on a printed circuit board such that the distance and signal track length between the Sout output port pins on one device and the Sin input port pins of the next device in the ring is minimized. Alternately, the four memory devices can be collected in a system in package module (SIP) which further minimizes signal track lengths. Memory controller 602 and serial-connected memory devices 604 to 610 are connected to form a ring topology, meaning that the last memory device 610 provides its outputs back to the memory controller 602. As such, those skilled in the art will understand that the distance between memory device 610 and memory controller 602 is easily minimized.

In the example system embodiment of FIG. 6, four memory devices are shown connected in series in a ring topology with the memory controller with a source synchronous clock, however any suitable number of memory devices can be included and the clock can be provided in parallel to all the memory devices in the system.

Figure 7A:
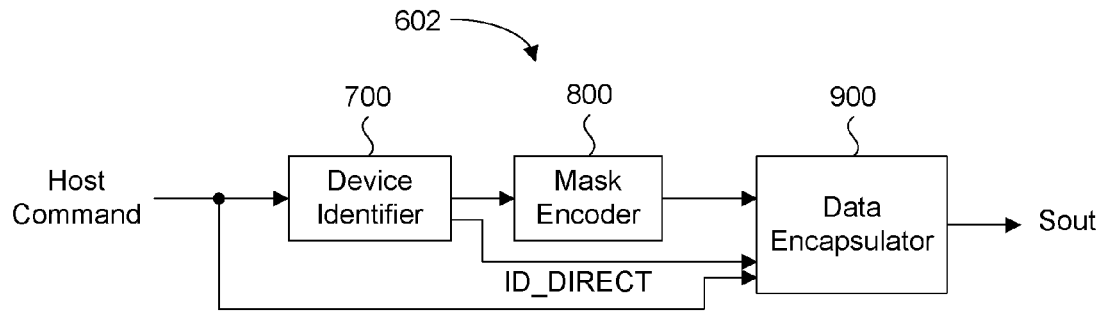
FIG. 7A is a block diagram illustrating the circuit blocks responsible for generating the code information used to select multiple memory devices in the memory system of FIG. 6.

In the embodiment of FIG. 6, the memory controller 602 is responsible for receiving a host command for executing the same operation in at least two different memory devices. Accordingly, the memory controller 602 includes circuitry for generating the appropriate code information, and each of the memory devices 604, 606, 608 and 610 includes circuitry for decoding the code information in the command packet issued by the memory controller. FIG. 7A is a block diagram illustrating the circuit blocks responsible for generating the code information used to select multiple memory devices in the memory system of FIG. 6.

FIG. 7A illustrates an example of the memory controller 602 according to an embodiment of the invention. In the presently shown example, other circuit blocks responsible for providing and receiving the other signals shown in FIG. 6 are not shown in order to simplify the schematic. The memory controller 602 of the present example includes a device identifier 700, a mask encoder 800, and a data encapsulator 900. The device identifier 700 receives the command sent by the host, referred to as a host command, which may include information indicating that multiple memory devices are to execute the same operation. In such a situation, the device identifier 700 identifies the devices needed to execute the operation, which could depend on other preset algorithms for controlling wear levelling for example. Those skilled in the art will understand that the selection of specific memory devices can be made based on any preset criteria. Once identified, the device identifier 700 designates these devices and provides their pre-assigned ID number or addresses to the mask encoder 800. The ID numbers can be binary values for example, hence each memory device will have a unique binary ID number.

Figure 7B:
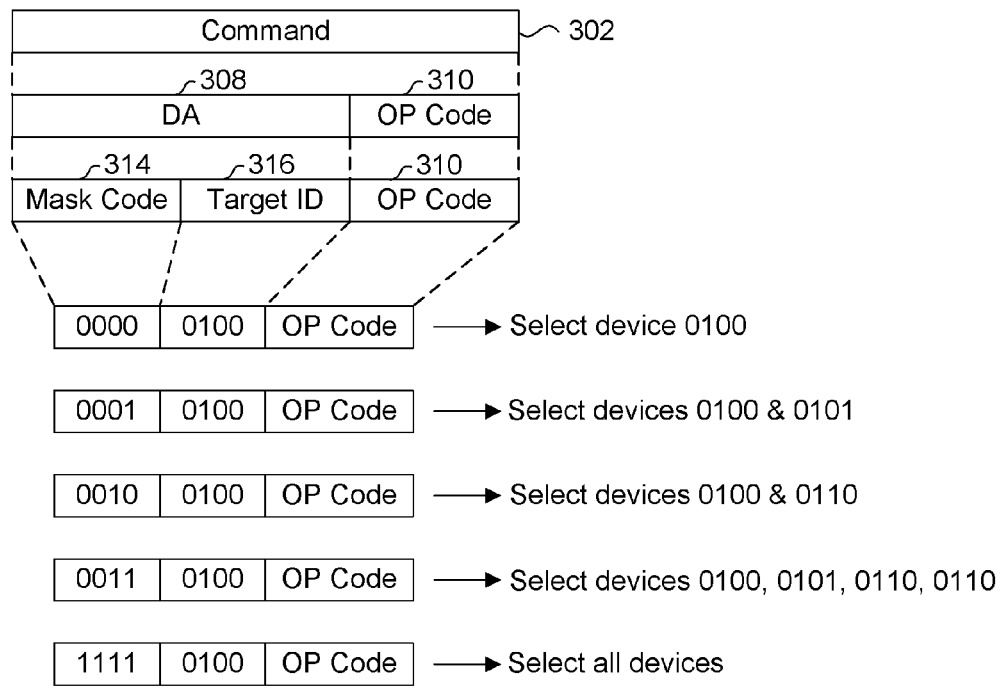
FIG. 7B shows possible example command fields of a command packet.

The mask encoder 800 encodes the selected memory device ID number or addresses into code information, and provides this code information to the data encapsulator 900. As will be described later, the mask encoder 800 performs logical operations on all the selected ID numbers in order to generate the code information. The data encapsulator 900 generates the command packet, which as previously discussed, can include an op code, a device address, optional address information for reading or programming to a memory array in the memory device, and write data for programming. The command packet is then sent to the serial-connected devices starting with the first memory device 604 that is connected directly to the Sout output port of memory controller 602. FIG. 7B presents examples of where the code information is stored in the command packet.

FIG. 7B shows possible example command fields 302 of a command packet 300, where as previously described, the command field 302 includes a device address sub-field 308 and an OP Code sub-field 310. In the present example, each device address sub-field 308 includes a mask code portion 314 and a target ID portion 316, collectively 1 byte in width. Of course, the width of the device address sub-field 308 can be greater than 1 byte to accommodate a large number of addresses. It is notable that the mask code of 1111 selects all the memory devices to act on the command packet. Using a mask code of 1111 functions as a broadcast address, since all the memory devices would respond to the command packet.

Hence this is a viable alternative to the prior broadcasting scheme where a reserved address is stored in each memory device, and then compared with the address stored in the DA sub-field 308. When only one device is selected, all the bits in the mask code are set to zero, and the address of the device selected is sent in the Target ID field in the header of the packet. Hence, this is a viable alternative to systems where only one address is included in the header of the command, designating only one memory device to execute a certain command. For all other cases the number of bits which are set to "1" and the position of these bits depend on the number of devices selected and the addresses of these devices, as discussed above.

Figure 8:
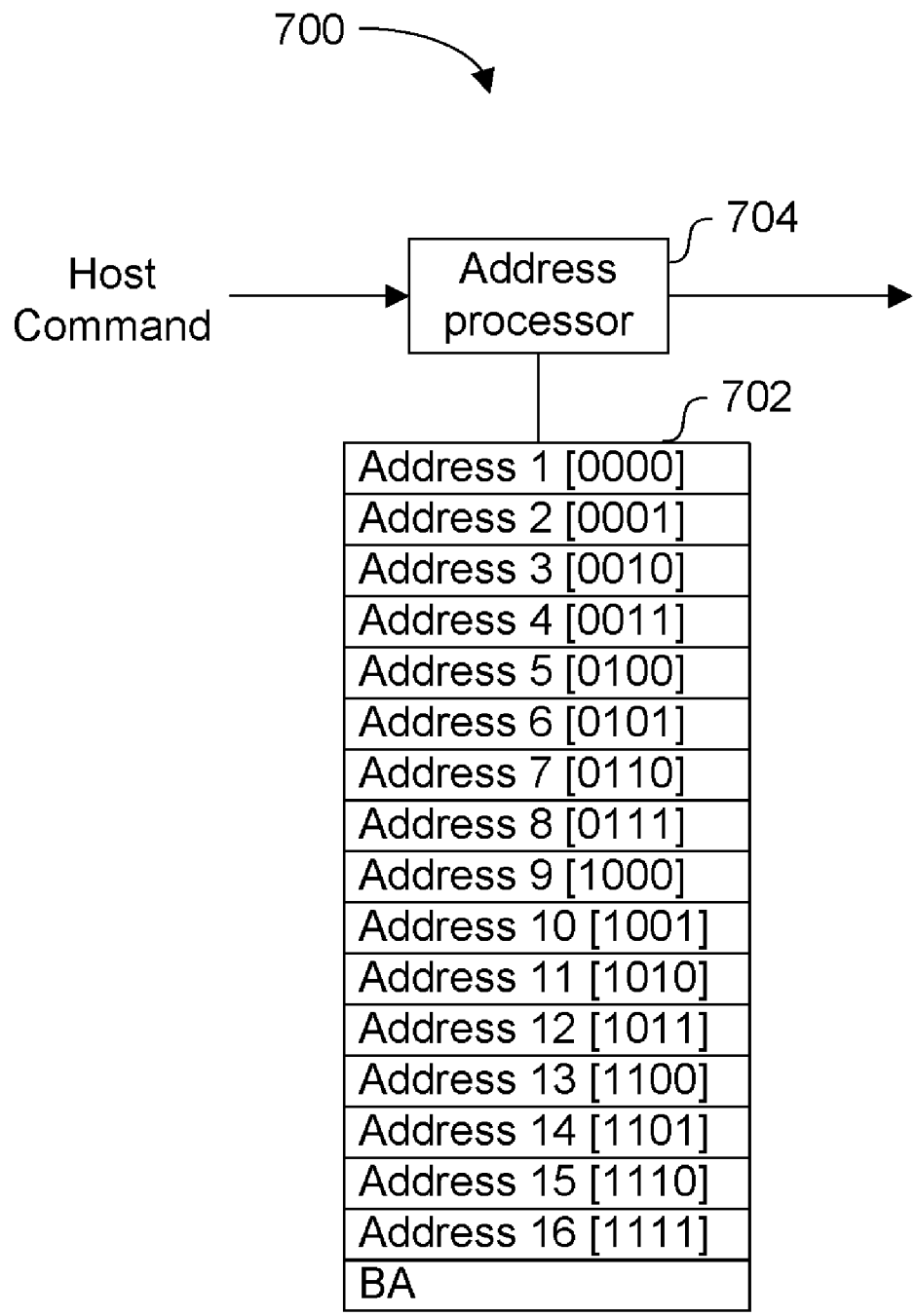
FIG. 8 illustrates an example of a device identifier in accordance with an embodiment of the present invention.

FIG. 8 illustrates an example of a device identifier 700 in accordance with an embodiment of the present invention. The device identifier 700 includes a table 702 or registers 702 for storing binary ID numbers resulting from any ID number generation algorithm, such as the ones described in the previously mentioned commonly owned patent applications. Each ID number stored in the table 702 is the address of one of the memory devices connected in series with the memory controller 602 in system 600. In the present example, it is assumed that the memory system includes 16 memory devices, hence there are 16 unique ID numbers that are stored in table 702. If the broadcasting function is used, then an additional entry in table 702 stores the preselected broadcast address BA. Persons skilled in the art will understand that device identifier 700 includes enough registers for storing ID numbers of a predetermined maximum number of memory devices. The device identifier 700 further includes an address processor 704 that is responsible for decoding the host command and then selecting one or more of the serial-connected devices to execute the operation indicated within the host command. The address processor 704 can include one or more preset algorithms for determining which memory devices are to be selected, if the host command designates an operation where multiple memory devices are to be selected. For example, one algorithm can select memory devices based on the available space for storing write data. Depending on the host command, the device processor 704 provides the ID numbers or addresses of the selected memory device(s) to the mask encoder 800.

The address processor 704 distinguishes between three possible scenarios as determined by the host command. In a first scenario only one memory device is designated. In a second scenario all memory devices are selected, and the broadcast address BA is provided. In the first and second scenario the mask encoder 800 is bypassed and either the broadcast address or the single ID number is passed directly to the data encapsulator 900 via the ID_DIRECT signal line. In a third scenario two or more memory devices are selected from all the memory devices, and their corresponding ID numbers are provided to mask encoder 800.

Figure 9:
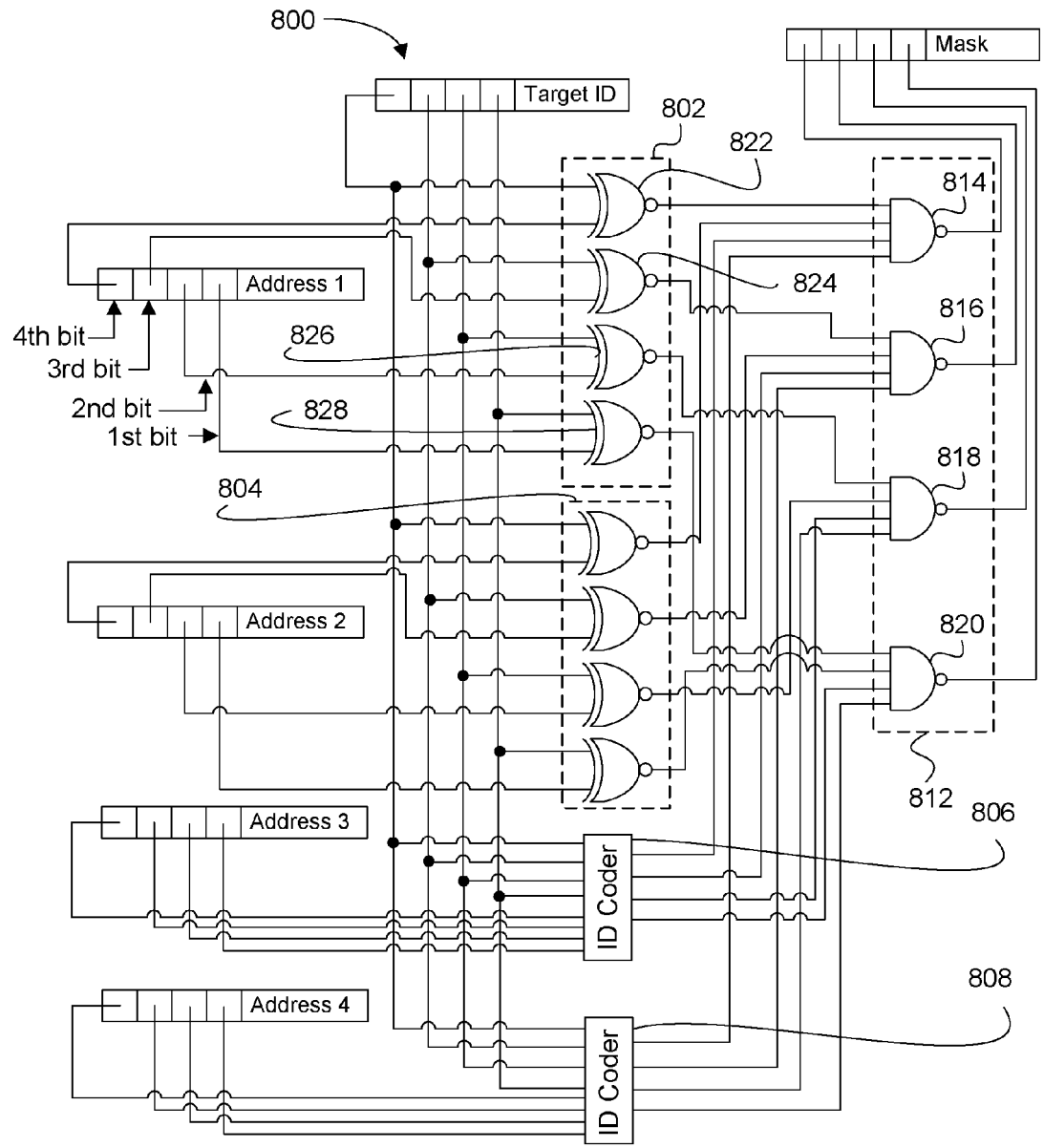
FIG. 9 is a circuit schematic illustrating an example of a mask encoder in accordance with an embodiment of the present invention.

FIG. 9 is a circuit schematic illustrating by way of example only, the mask encoder 800 of FIG. 7A in accordance with an embodiment of the present invention. FIG. 9 shows an encoder designed for encoding up to four ID numbers, however, someone of skill in the art would readily appreciate that the mask encoder shown can be designed and scaled to encode a mask code for two, eight, or any number of ID numbers without departing from the scope of the invention. In the present example, each ID number is represented as a four bit address.

A general overview of the operation of the mask encoder 800 of the present embodiment follows. When the selected subset of addresses provided by the device identifier 700 are received at the mask encoder 800, the mask encoder 800 selects any one of the selected ID numbers as a Target ID address. The designation of one of the selected ID numbers to be the Target ID can be arbitrary or based on any predetermined criteria. The Target ID address is used to encode a mask code, which together with the Target ID address, are sent to the serial-connected devices in the command packet. The mask code and the Target ID address are both included in a field of the command packet, such as the DA sub-field 308 of FIG. 3 for example, and are referred to hereinafter as the code information. Each ID number is logically combined with the Target ID for generating a coded ID number having the same number of bits as the original ID number in a first coding circuit. In a second and final coding circuit, the same bit positions of each coded ID number are logically combined together to generate a corresponding bit position for the mask code. In the present example, since the ID number addresses are four bits, a four bit mask code is generated after the final coding circuit.

Details of the mask encoder embodiment of FIG. 9 is now described in detail. The first coding circuit corresponds to a first coding stage, which includes ID coders 802, 804, 806 and 808. The second coding circuit corresponds to a second coding stage, which includes mask coder 812. ID coder 802 is designated for address 1, ID coder 804 is designated for address 2, ID coder 806 is designated for address 3, and ID coder 808 is designated for address 4, where each address corresponds to an ID number. In order to simplify the schematic, only the circuit details for ID coders 802 and 804 are shown, since all ID coders include the same circuits and are connected to their respective addresses and the Target ID in the same manner.

ID coder 802 includes a set of XNOR gates 822, 824, 826, and 828, each having one input for receiving a bit from a bit position of the Target ID and a second input for receiving a bit from a corresponding bit position of Address 1. As shown in FIG. 9, the most significant bit, being the fourth bit, is connected to a first input of XNOR gate 822. The corresponding bit of the Target ID, being the fourth bit, is connected to the second input of XNOR gate 822. Accordingly, the output of comparator 822 is the coded fourth bit of the Address 1. XNOR gates 824, 826 and 828 receive the third, second and first bits of Address 1 and the Target ID respectively, for generating coded third, second and first bits of Address 1. The XNOR gates of ID coders 804, 806 and 808 are configured in the same manner as described for ID coder 802, except that they receive bits from Address 2, Address 3 and Address 4 respectively. The use of XNOR gates is only intended to be an example of one possible coding logic. Someone of skill in art will appreciate that other combinations of logic gates may be used in order to achieve the same results. For example, XNOR logic can be obtained with different combinations of logic gates known in the art.

The second coding circuit 812 includes four NAND logic gates 814, 816, 818, and 820. Each NAND logic gate receives a bit from the same logical bit position of each coded address for generating one bit for the corresponding bit position of the mask code. For example, the output of XNOR gate 822 being the fourth bit position of the coded ID number corresponding to Address 1, is connected to a first input of NAND gate 814. The second to fourth inputs of NAND gate 814 are connected to the outputs of each XNOR gate that provides the fourth bit position of the other coded ID numbers. Hence, the output of NAND gate 814 represents the fourth and most significant bit of the mask code, while the outputs of NAND gates 816, 818 and 820 represent the third, second and first most significant bits respectively. While NAND gates are used in the second coding circuit of FIG. 9, persons skilled in the art will understand that any type of logic circuitry can be used for generating each bit of the mask code in response to the same bit positions of each coded ID number.

It is also possible to have the address processor of FIG. 7A incorporated within the mask encoder 800. In which case, the mask encoder can detect the addresses of the selected devices from the command received at the memory controller internally. However, for simplification purposes, each function has been described separately, for a better understanding of the invention described and claimed herein.

Figure 10A:
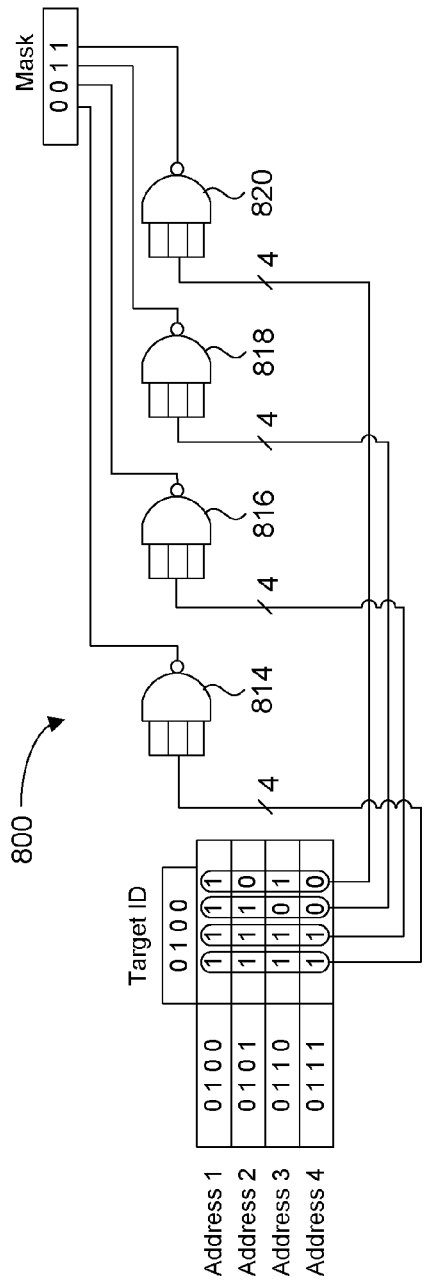
FIG. 10A is table illustrating an example operation of the mask encoder of FIG. 9.

FIG. 10A is an illustration of an example operation of the mask encoder 800 of FIG. 9. This example illustrates the generation of a mask code when the following four ID number addresses are received at the mask encoder: 0100, 0101, 0110, 0111. It is further assumed that the mask encoder chooses address 0100 as the Target ID. The ID number addresses are shown in the left-most column of the matrix shown in FIG. 10A, while the Target ID is shown at the top row of the right-most column of the matrix shown in FIG. 10A. Following the logic shown in FIG. 9, each ID coder 802, 804, 806 and 808 generates coded ID numbers shown in the right-most column of the matrix. For example, the bits of the coded ID numbers can be seen as an M×N matrix, where M is a non-zero integer representing a column position of the matrix and N is a non-zero integer representing a row position of the matrix. Each bit in the column is inputted into a NAND gate, such as NAND gates 814, 816, 818 and 820 of FIG. 9, and the output of each NAND gate represents one bit of the mask code whose position in the mask corresponds to the position of the column in the matrix of FIG. 10A. For example the output of the NAND gate that receives the bits of the right-most column of bits corresponds to the right-most bit of the mask code. Expressed differently, the matrix can be transposed from an M×N matrix into an N×M matrix, and the entries of each row are provided to a respective NAND gate.

Figure 10B:
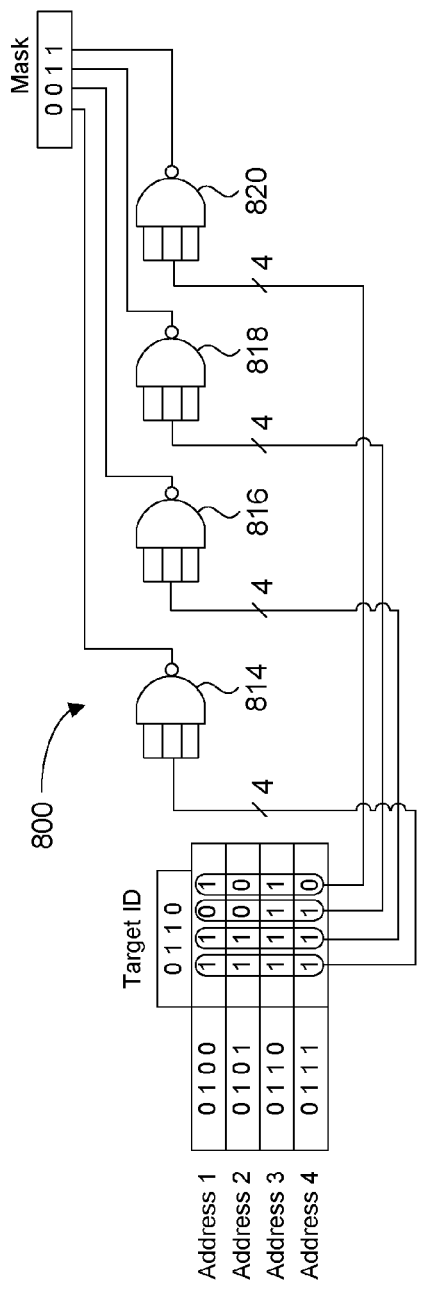
FIG. 10B is table illustrating another example operation of the mask encoder of FIG. 9

According to the present embodiment, the mask code for any set of selected addresses is unique to those addresses, and is based on the numerical values of the selected addresses regardless of which address is selected as the Target ID. For instance if, in the example of FIG. 10B, the Target ID selected was 0110 instead of 0100, the resulting coded ID numbers corresponding to Address 1, Address 2, Address 3 and Address 4 would be as follows: 1101, 1100, 1111, and 1110 respectively. However, when these results are inputted to their respective NAND gates, the mask code obtained is still 0011.

A useful property of the mask code and the selected addresses is that the logical OR'ing addition of the mask code with any of the selected addresses produces the selected address having the largest numerical value. FIG. 11 shows a matrix with the selected addresses appearing in the left-most column, and the mask code appearing in the top row of the right-most column. The logical OR'ing of the mask code with each selected address yields the 0111 result, which corresponds to Address 4. As will be discussed later, this property can be used to identify the last designated device to execute the command, and switch the command signal output Qn to a null value in order to save the energy of the signal carrying the command, since the devices between the last designated device and the memory controller are not designated. For instance, a null value could mean a static signal having the same logic level.

Once the mask code is generated, the data encapsulator 900 provides a command packet including the operation code of the command, optional address and optional write data and the mask code. As shown in FIG. 3, the mask code and Target ID address can be included in the DA sub-field 308, the operation code can be included in the OP code sub-field 310, any address can be included in the Address field 304 and any optional write data can be included in the Data field 306. The data encapsulator 900 then sends the command packet to all the memory devices in the system.

The previously described embodiments illustrate how a mask code of a fixed number of bits is generated to represent all the addresses corresponding to a subset of a plurality of memory devices in the memory system. In order for the designated memory devices to respond to the op code of the command packet, each memory device includes an ID processor for decoding the mask code and enabling a command interpreter of the memory device to act upon an op code of the command packet, only when that memory device has a device ID number that is a member of the subset of selected addresses encoded in the mask code.

Figure 12:
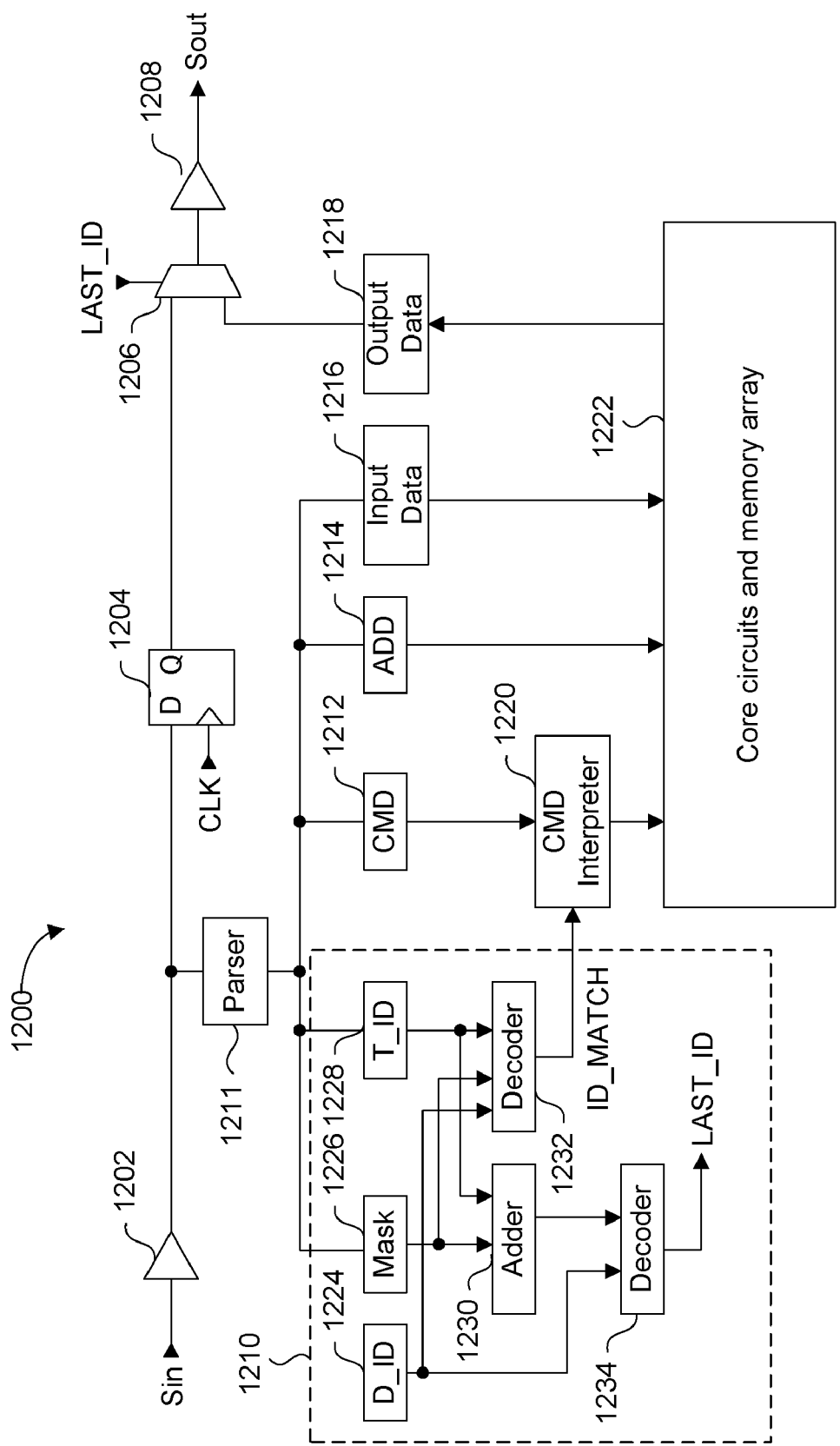
FIG. 12 is block diagram illustrating an embodiment of a data input/output interface of a memory device designed for serial interconnection with another memory device or a memory controller.

FIG. 12 is block diagram illustrating an embodiment of a data input/output interface of a memory device designed for interconnection with another memory device or a memory controller for the purposes of receiving and providing data in a serial bitstream, such as each of the memory devices and the memory controller shown in FIG. 6 for example. The data input/output interface 1200 includes a data flow-through path and a memory path.

The data flow-through path includes an input buffer 1202, a flip-flop 1204, a data selector 1206 and an output buffer 1208, all connected in series between the Sin input port and the Sout output port. The data flow-through path couples command packets and any read data received at its Sin input port from a previous memory device to the Sout output port. Therefore command packets can be provided to all the memory devices in the serial-connected memory system. The flip-flop 1204 re-aligns the bits of data received at Sin relative to a clock, while selector 1206 can selectively output data from flip-flop 1204 or read data from the memory device in response to signal LAST_ID. Accordingly, selector 1206 can be implemented as a multiplexor/demultiplexor.

The memory path includes an ID processor 1210, a command parser 1211, command register 1212, address register 1214, input data register 1216, output data register 1218, command interpreter 1220, and a core circuit block 1222. Since the command packet structure is predefined, as shown in FIG. 3 for example, the command parser is configured to load each of the noted registers with the corresponding information. Once loaded, the command register provides an op code to the command interpreter 1220, the address register 1214 provides row and column address information to the core circuit block 1222, and the input data register provides write or program data to the core circuit block 1222. The output data register stores read data from the memory array of the core circuit block 1222. The command interpreter 1220 is a well known component that is used for decoding the op code included in the command packet, and provides control signals for use by the core circuit block 1222 and other circuits of the memory device. The core circuit block 1222 includes a memory array and core circuits used to control the memory array, such as row, block and column decoders, and data path circuits, for example. The ID processor 1210 includes a device ID register 1224, a mask register 1226 a target ID register 1228, an adder 1230, an ID match decoder 1232 and a last ID decoder 1234. Registers 1226 and 1228 are loaded by the command parser 1211, and provide their stored information to the adder 1230 and decoders 1232 and 1234. The device ID can be dynamically pre-stored in register 1224 during power up initialization of the memory system, or it can be pre-stored during manufacturing of the memory device.

The data input/output interface 1200 receives the command packet sent from the memory controller or a previous memory device via input port Sin, and stores the mask code of the code information in mask register 1226, the Target ID of the code information in a Target ID register 1228, and the op code command in command register 1212. The ID match decoder 1232 receives the device ID, the mask code and the Target ID from registers 1224, 1226 and 1228 respectively, and executes logical operations thereupon. Generally, the ID match decoder 1232 compares the information of the mask code to the assigned ID number/address of the memory device. If the assigned ID number is found to be encoded in the mask code, the output signal ID_MATCH of ID match decoder 1232 is set to an active logic level, such as a logic 1 for example, which enables the command interpreter 1220 to interpret the op code stored in the command register 1212. Otherwise, the command interpreter 1220 ignores the op code stored in command register 1212.

In the presently described embodiments, the ID processor 1210 can include only the registers 1224, 1226, 1228 and ID match decoder 1232. According to another embodiment of the present invention, power consumption can be reduced by inhibiting or preventing the last designated memory device from sending the command packet to any remaining memory devices in the memory system. Therefore, in addition to registers 1224, 1226, 1228 and ID match decoder 1232, ID processor 1210 can further include adder 1230 and last ID decoder 1234, which together form an output inhibiting circuit. As previously discussed, the ID number/address of any designated memory device can be added to the mask code for generating the last designated memory device ID number/address. In the presently shown example of FIG. 12, adder 1230 produces the address of the last designated memory device by adding the mask code stored in mask register 1226 to the Target ID stored in target ID register 1228, which is the address of one of the designated devices. Then last ID decoder 1234 compares the address of the memory device stored in the device ID register 1224 with the address of the last designated device generated by adder 1230. If there is no match (also referred to as a mismatch) between the address of the memory device and the generated address of the last designated device, the output signal LAST_ID is set to an inactive logic level, such as logic 0 for example, and the selector 1206 enables the command packet to be forwarded to the next device by coupling the output of flip-flop 1204 to output buffer 1208. Otherwise, if a match exists, the output signal LAST_ID is set to an active logic level, such as logic 1 for example, and the selector 1206 couples the input of output buffer 1208 to the output data register 1218.

The output data register 1218 may store output data from a previous read operation, or may be reset. In either situation, the output data register 1218 statically provides one bit of data to selector 1206, which may be a logic 1 or 0 signal. Therefore Sout of the last designated memory device drives and maintains a static logic level. Accordingly, all subsequent memory devices will receive this static logic level and power consumption of the memory system is conserved since there is no further signal switching by any of the Sout output ports of the remaining memory devices. In the present embodiment, the command packet is inhibited from being sent to the remaining memory devices in the system by coupling the output buffer 1208 to the output data register 1218. In alternate embodiments, the output buffer 1208 can be disabled by signal LAST_ID, or the output of selector 1206 can be disabled or disconnected from output buffer 1208, or the output of flip-flop 1204 can be disabled or disconnected from selector 1206.

Figure 13:
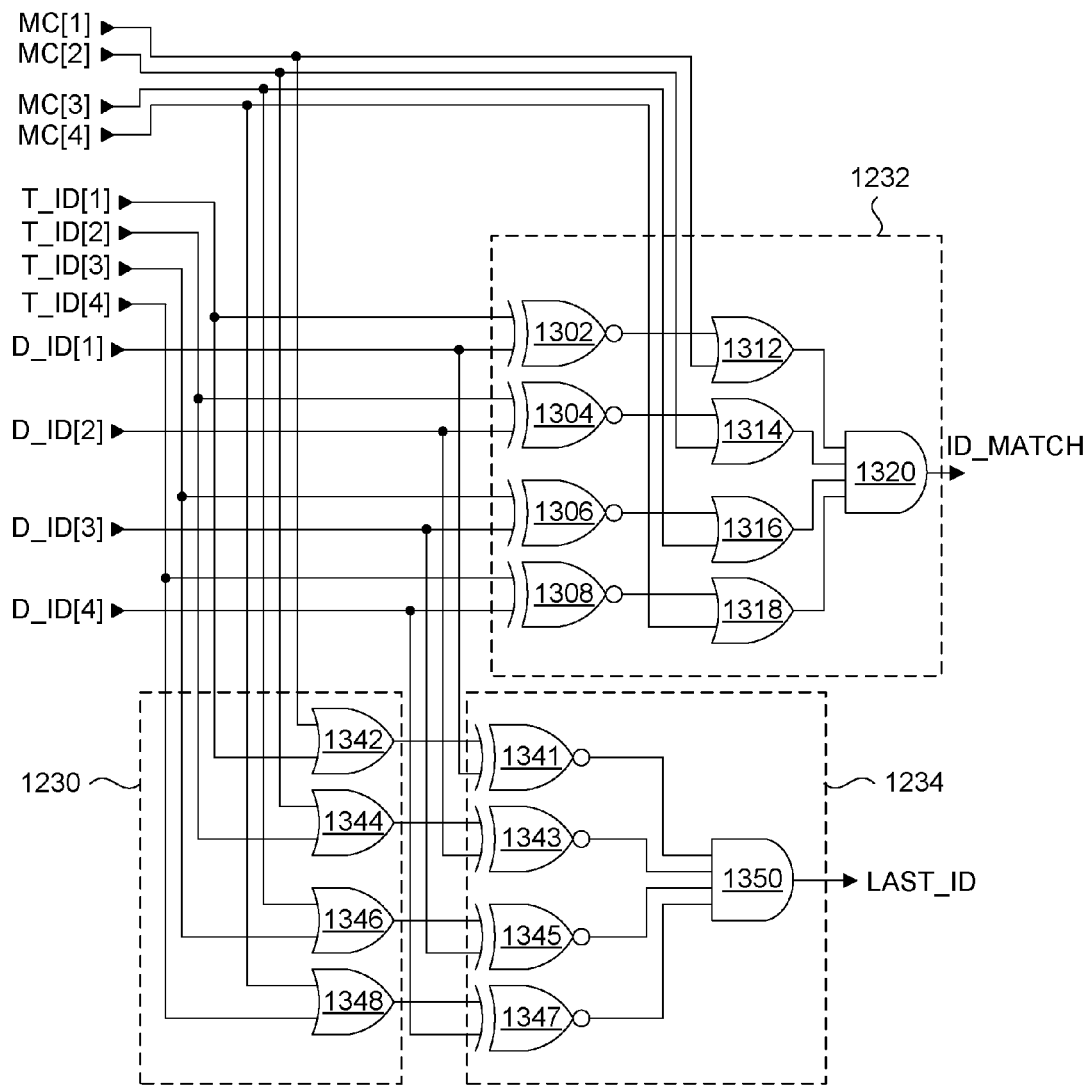
FIG. 13 is a circuit schematic illustrating, by way of example, ID match decoder and last ID decoder.

FIG. 13 is a circuit schematic illustrating, by way of example, ID match decoder 1232 and last ID decoder 1234. The ID match decoder 1232 logically combines bits of the mask code MC[1:4], the target ID number T_ID[1:4] and the ID number D_ID[1:4] of the memory device in order to determine whether or not the present memory device is designated. More specifically, ID match decoder 1232 determines if the ID number of the memory device is encoded in the mask code. The last ID decoder 1234 logically combines the mask code MC[1:4] and the ID number D_ID[1:4] of the memory device in order to determine whether the present memory device is the last designated device for the corresponding command packet. It is assumed for the present example that the mask code, the target ID number and the device ID number are four bits.

The ID match decoder 1232 includes a set of X-NOR logic gates 1302, 1304, 1306, and 1308, a set of OR logic gates 1312, 1314, 1316, and 1318, and an AND logic gate 1320. Collectively, all four X-NOR logic gates form a comparator used to compare each bit of the Target ID received with the corresponding bit position of the device ID number. For example, X-NOR logic gate 1302 compares the least significant bit of the target ID number T_ID[1] with the least significant bit of the device ID number D_ID[1], and provides a comparison result. All the four comparison results can be referred to as a coded target ID number. The output of each X-NOR logic gate is connected to one input of a corresponding OR logic gate. The other input of each OR logic gate receives a corresponding bit position of the mask code. Collectively, all four OR logic gates forms an adder for adding the coded target ID number with the mask code to provide a modified coded target ID number. The resulting output from each OR logic gate is provided to AND logic gate 1320 acting as a multiplier, which can drive signal ID_MATCH to either a logic 1 or 0. In the present example, a logic 1 output from each of the adders 1312, 1314, 1316 and 1318 indicates that the present memory device is designated for acting upon the command packet. This state is represented by ID_MATCH being at a logic 1. If at least one OR logic gate outputs a logic 0, then the present memory device is not designated, ID_MATCH is set to logic 0, and the op code is ignored. When set to logic 1, ID_MATCH enables the command interpreter 1220 to interpret the op code stored in the command register 1212 in order to generate the appropriate control signals for controlling circuits in the core circuit block 1222.

The adder 1230 includes a set of OR logic gates 1342, 1344, 1346, and 1348, while the last ID decoder 1234 includes a set of XNOR logic gates 1341, 1343, 1345, and 1347, and an AND logic gate 1350. The adder 1230 adds each bit of the mask code MC[1:4] to the corresponding bit position of the target ID number T_ID[1:4]. For example, OR logic gate 1342 receives the most significant bits MC[4] and T_ID[4]. As previously discussed, such an addition results in the address of the last designated device at the outputs of the OR logic gates. Thus, the output of each OR logic gate 1342, 1344, 1346 and 1348 represents a bit of the last designated device ID number. The bits of the generated last designated device ID number are provided to one input of XNOR logic gates 1341, 1343, 1345 and 1347. The other input of each XNOR logic gate of device of ID decoder 1234 is connected to the corresponding bit of the device ID number. Collectively, the XNOR logic gates 1341, 1343, 1345 and 1347 function as a comparator for comparing the device ID number to the generated last designated device ID number. In the present example, a logic 1 at the output of XNOR logic gates 1341, 1343, 1345 and 1347 indicates that the present memory device is the last designated device for the corresponding command packet. If at least one of the outputs is a logic 0, then the present memory device is not the last designated device. The output of XNOR logic gates 1341, 1343, 1345 and 1347 is connected to the input of AND logic gate 1350, which functions as a multiplier. When the output LAST_ID of AND logic gate 1350 is at logic 1, selector 1206 of FIG. 12 disconnects flip-flop 1204 from the output buffer 1208, and connects data output register 1218 to the output buffer 1208 in order to save the energy. Otherwise, the command packet is provided to the next device.

Figure 14:
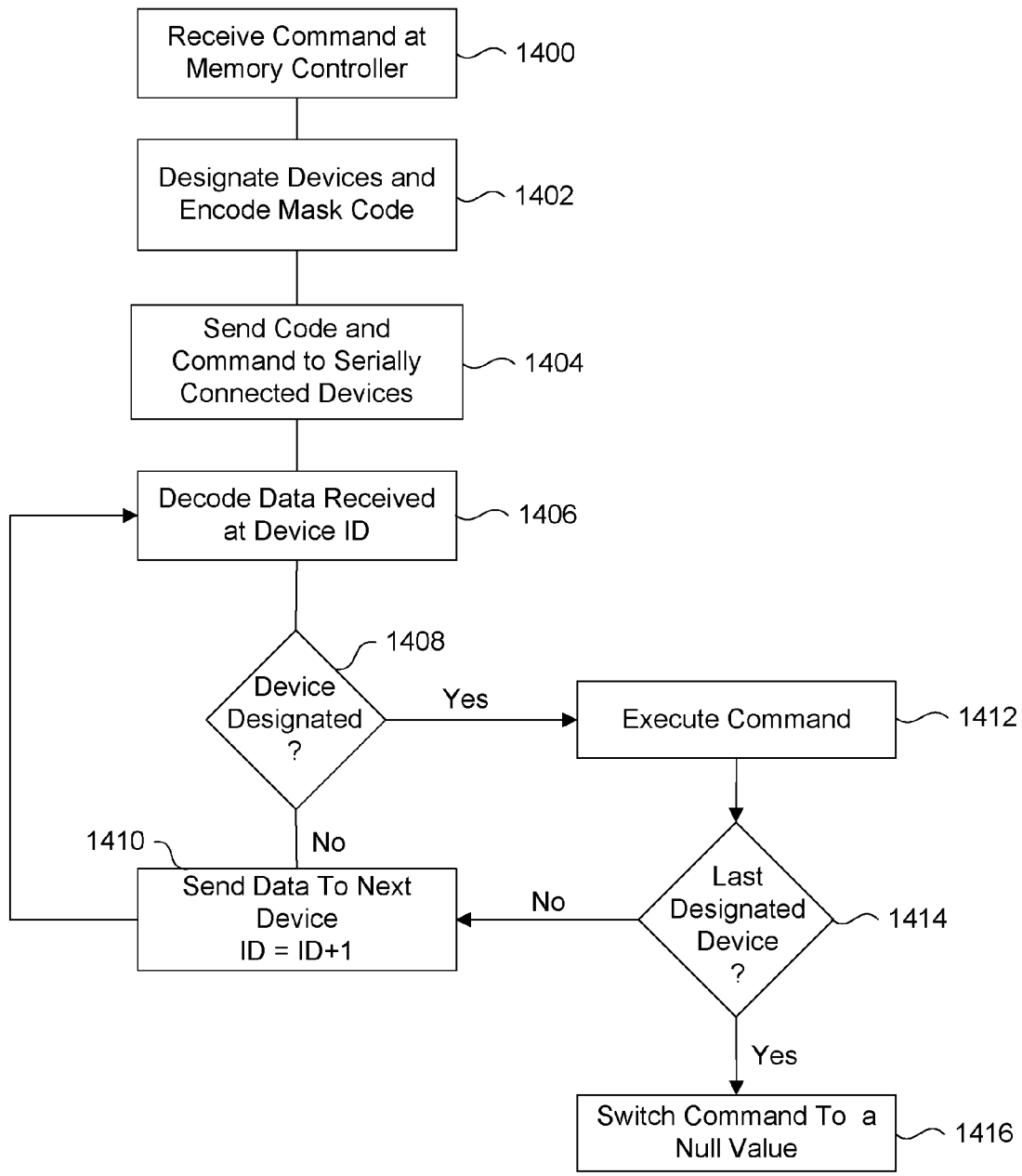
FIG. 14 is a flow chart showing the operation of the memory system of the present embodiments in response to a command packet selectively addressing a subset of the memory devices; and, FIG. 15 illustrates an example memory system having six serial-connected memory devices.

Following is an example operation of the ID match decoder 1232 and the last ID decoder 1234 shown in FIG. 13, using the previously designated ID numbers for encoding the mask code. As previously shown, when the designated four ID numbers are 0100, 0101, 0110, 0111, the resulting mask code is 0011. It is assumed that the command packet includes the target device ID of 0100 and the mask code of 0011, and this command packet is received by a memory device having the assigned ID number 0101. Accordingly, each memory device receives the command packet and parses the fields such that the mask code register 1226 stores the four bit mask code while the target ID register 1228 stores the four bit target device ID number. Table 1 below illustrates the mapping of the bits to the corresponding bit positions of the mask code, the target device ID number and the designated device ID numbers. FIG. 14 is a flow chart showing the operation of the memory system of the present embodiments in response to a command packet selectively addressing a subset of the memory devices.

TABLE 1

| Mask code | MC[4] 0 | MC[3] 0 | MC[2] 1 | MC[1] 1 |
|---|---|---|---|---|
| Target ID | T_ID[4] 0 | T_ID[3] 1 | T_ID[2] 0 | T_ID[1] 0 |
| Device ID 1 | D_ID[4] 0 | D_ID[3] 1 | D_ID[2] 0 | D_ID[1] 0 |
| Device ID 2 | D_ID[4] 0 | D_ID[3] 1 | D_ID[2] 0 | D_ID[1] 1 |
| Device ID 3 | D_ID[4] 0 | D_ID[3] 1 | D_ID[2] 1 | D_ID[1] 0 |
| Device ID 4 [4] | D_ID[4] 0 | D_ID[3] 1 | D_ID[2] 1 | D_ID[1] 1 |

In FIG. 14, it is assumed that the host (not shown) issues a command i.e. a read or write data command from or to memory devices. The command is received by the memory controller to which the devices are connected in series at step 1400. The memory controller interprets the command and determines that memory devices having ID numbers 0100, 0101, 0110 and 0111 are to execute the command. At step 1402 the four selected device ID numbers (Device ID 1, Device ID 2, Device ID 3 and Device ID 4) are used to compute or encode the mask code that is specific to the designated devices. The mask code and the Target ID are encapsulated into a command packet along with the op code corresponding to the command issued by the host, and then sent to each of the memory devices in sequence at step 1404. At step 1406, the first memory device connected to the memory controller decodes the mask code and target ID received in the command packet to determine whether it is designated or not via its ID match decoder 1232 for example. If this memory device has an ID number other than the four listed in Table 1, then this first memory device is not designated. Therefore at step 1408 signal ID_MATCH from its ID match decoder 1232 would be set to an inactive logic 0. Then the command packet is passed on to the next memory device in the system at step 1410, and the method loops back to step 1406 which is executed by the next memory device.

If the next memory device is assigned Device ID 1, then it is one of the designated memory devices. The decoding step 1406 is now described with reference to FIG. 14 and using the values in Table 1. When the device ID is 0100, the outputs of XNOR logic gates 1302, 1304, 1306 and 1308 is 1111 respectively. After this result is OR'd with the mask code, the outputs of OR logic gates 1312, 1314, 1316, and 1318 is 1111 respectively. Therefore, AND logic gate 1320 sets ID_MATCH to an active logic 1. Because ID_MATCH is an active logic 1, the present memory device is determined to be designated at step 1408. Therefore, the op code stored in the command register 1212 is interpreted by command interpreter 1220 at step 1412 and executed. In one embodiment of the present method, the method ends at step 1412 while the command packet is passed to the next memory device at step 1410. Accordingly, steps 1406, 1408 and 1410 are executed by all the non-designated memory devices, while steps 1406, 1408, 1410 and 1412 are executed by memory devices having Device ID 2, Device ID 3 and Device ID 4. More notably, step 1410 is executed by the last designated memory device having Device ID 4. However, if there are any subsequent memory devices connected in series between the last designated memory device and the memory controller, then each of these intervening memory devices will receive and pass on the command packet to the next memory device until the command packet is received by the memory controller.

As previously mentioned, since the last designated memory device has executed the command, there is no need for the intervening memory devices to even receive the command packet as they were never designated to execute the command. Furthermore, the action of passing the command packet from non-designated memory device to non-designated memory device consumes signal transition power. In the worst case scenario using the previous example, the first four memory devices in the memory system are the designated memory devices, leaving a maximum number of non-designated intervening memory devices.

In an alternate embodiment of the present method, power consumption can be reduced by having each designated memory device check whether it is the last designated device for the same command or not. Continuing from step 1412 in FIG. 14 and assuming that the current memory device has Device ID 3, a determination is made at step 1414 to check if the present memory device is the last designated memory device. This is done via the last ID decoder 1234. For example, the outputs of OR logic gates 1342, 1344, 1346 and 1348 of adder 1230 is 0111, regardless of the current device ID number. This result is the generated last designated device ID, which is compared with the device ID number of the present memory device, that being Device ID 3. The outputs of XNOR logic gates is then 1110 respectively. Accordingly, the AND logic gate 1350 drives LAST_ID to an inactive logic 0, meaning that the present memory device is not the last designated memory device. In such a scenario, the method of FIG. 14 proceeds to step 1410 and the command packet is passed onto the next memory device.

On the other hand, if the present memory device has Device ID 4, then the 0111 output of adder 1230 is compared to Device ID 4, resulting in an output of 1111. Accordingly, the AND logic gate 1350 drives LAST_ID to an active logic 1, meaning that the present memory device is the last designated memory device. In such a scenario, the method of FIG. 14 proceeds to step 1416. At step 1416, the command packet is inhibited, or prevented, from being passed to the next memory device as the Sout output port of the memory device is set to a static null value. This null value can either be a static logic 0 or logic 1 value. As shown in FIG. 12 by example, this null value can be obtained by coupling output buffer 1208 to the output data register 1218.

Based on the circuit example shown in FIG. 13, step 1414 is executed in parallel with step 1408, where the memory device is detecting whether it is designated or not via ID match decoder 1232. According to an alternate circuit example, step 1408 is executed in series after step 1408, provided the ID match decoder 1232 determines that the memory device is one that is designated. This can be done by connecting ID_MATCH to another input of AND logic gate 1350. Hence AND logic gate 1350 is enabled only when ID_MATCH is at the logic 1 value.

Therefore as shown by the previously discussed embodiments of the invention, a subset of memory devices, referred to as designated or selected memory devices, can respond to a single command packet issued by the memory controller. The previously shown examples of the mask encoder 800 for generating the code information embedded in the command packet can be designed to receive exactly four designated device ID addresses, or scaled to receive the maximum number of anticipated designated addresses. However, such a mask encoder will increase the area of the memory device due to the additional logic circuitry. Therefore, if the size of mask encoder 800 is to be minimized, then it can be limited to receive up to four, eight or any grouping of $2^n$ device ID numbers. However, if there are more designated device ID numbers than can be accommodated by the mask encoder 800, then at least two execution cycles are required, where one cycle includes encoding of the mask code and issuance of the corresponding command packet to the memory devices. In otherwords, at least two different groups of memory devices will execute the same command, but in response to at least two different command packets.

Figure 15:
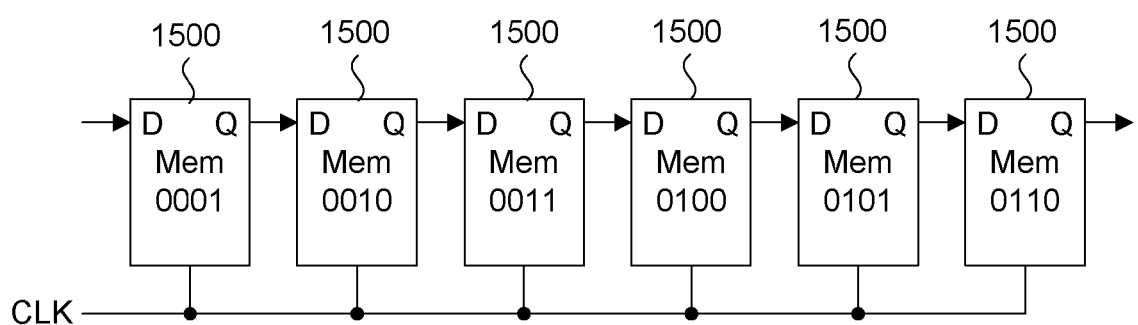

FIG. 15 illustrates the selection of six (6) serial-connected memory devices 1500 in a memory system, where the mask encoder is configured to receive a maximum of four designated device ID numbers. It is assumed that each memory device has the previously described ID processor 1210. In this example, the address processor 704 of FIG. 8 provides the mask encoder 800 with the ID numbers of the selected devices in groups of $2^n$ where n is 2. When the ID numbers of the devices shown in FIG. 15 are to be presented to the mask encoder 800, the address processor 704 provides the ID numbers of theses devices in two groups. First is a group of two addresses ($2^1$), and second is a group of four addresses ($2^2$). The order can be reversed with no impact on the operation of the system. It is noted that the address processor 704 ensures that the ID numbers of the selected devices provided to the mask encoder 800 within one grouping do not include complementary ID numbers. Example complementary ID number pairings include 0100 and 1011, 1100 and 0011 etc. Therefore, in a first execution cycle, a first mask code is generated using the group of two addresses. The designated two memory devices then execute the op code in the command packet. In a second execution cycle following the first, the designated four memory devices execute the same op code in the second command packet.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

The above-described embodiments of the invention are intended to be examples only. For instance, the invention is not limited to the gates shown in the drawings. Someone of skill in the art would appreciate that other circuits and schematics can be used that perform the same functions performed by the gates. Other coder and decoder configurations may also be used in the memory controller and the series connected devices. Alterations, modifications and variations can be effected to the particular embodiments by those of skill in the art without departing from the scope of the invention, which is defined solely by the claims appended hereto.

What is claimed is:

1. A method for selecting a subset of devices of a plurality of devices serial-connected to a memory controller to execute a command, comprising:
    encoding identification (ID) numbers of each of the subset of devices for providing code information by performing mathematical operations to logically combine the ID numbers of the subset of devices to generate a mask;
    providing a command packet including an op code and the code information to each of the plurality of devices;
    decoding the code information received by each of the plurality of devices by, at each device, performing a mathematical operation on the mask and an ID number stored in the device, to determine if the mask encodes the ID number stored in the device; and
    executing the op code if the ID number stored in the device is encoded in the received code information.

2. The method according to claim 1, wherein the memory controller provides 2x of the ID numbers, where x is an integer greater than zero.

3. The method according to claim 1, wherein each of the ID numbers is N-bits in length, and the code information includes a Target ID number N-bits in length and the mask code N-bits in length, where N is an integer value greater than 0.

4. The method according to claim 3, wherein the step of encoding comprises:
    selecting one ID number of the subset of devices as the Target ID number;
    comparing the ID numbers of each of the subset of devices with the Target ID number for generating corresponding coded ID numbers; and
    logically combining a bit in the same bit position from each of the coded ID numbers for generating one bit having the corresponding bit position in the mask code.

5. The method according to claim 4, wherein there are M ID numbers corresponding to the subset of devices, where M is an integer value greater than 0.

6. The method according to claim 5, wherein the step of comparing comprises steps of:
    outputting the comparison results in an M*N matrix; and
    transposing the M*N matrix into an N*M matrix.

7. The method according to claim 6, wherein the one bit is generated by executing a logical function upon the comparison results in one of the N rows of the N*M matrix.

8. The method according to claim 7, wherein a first bit of the mask code generated from the first row of the N*M matrix represents a most significant bit of the mask code, and a last bit of the mask code generated from the last row of the N*M matrix represents a least significant bit of the mask code.

9. The method according to claim 4, wherein the step of comparing comprises a step of executing an XNOR function between the ID numbers of each of the subset of devices with the Target ID number.

10. The method according to claim 4, wherein the step of logically combining comprises a step of executing a NAND function between bits in the same bit position from each of the coded ID numbers.

11. The method according to claim 4, wherein the step of decoding comprises a step of processing the ID number stored in the device with the Target ID number and the mask code to provide an indication that all bit positions of the ID number stored in the device are encoded in the mask code.

12. The method according to claim 11, wherein the step of processing comprises
comparing bits of each bit position of the ID number stored in the device with the corresponding bits of each corresponding bit position of the Target ID number for generating a coded target ID number;
adding the mask code to the coded target ID number for providing a modified coded target ID number; and
multiplying the bits of the modified coded target ID number with each other to provide the indication that all bit positions of the ID number stored in the device are encoded in the mask.

13. The method according to claim 12, wherein the step of comparing the bits of each bit position of the ID number stored in the device comprises a step of executing an XNOR logic function; the step of adding the mask code to the coded target ID number comprises a step of executing an OR logic function; and the step of multiplying the bits of the modified coded target ID number comprises a step of executing an AND logic function.

14. The method according to claim 3, wherein the step of providing the command packet comprises steps where each of the plurality of devices receives the command packet from one of a previous device and the memory controller, and passes the command packet to one of a subsequent device and the memory controller, the previous device and the subsequent device including memory devices.

15. The method according to claim 14, further comprises a step of inhibiting the command packet from being passed to one of the subsequent device and the memory controller when the last device of the subset of devices decodes the code information.

16. The method according to claim 15, wherein the step of inhibiting comprises steps of:
logically combining the Target ID number, the mask code and the ID number stored in the device to provide a last device signal; and
setting an output buffer to a null value in response to the last device signal.

17. The method according to claim 16, wherein the step of logically combining comprises steps of:
adding the Target ID number to the mask code to obtain a last designated device address; and
comparing the last designated device address to the ID number stored in the device, the last device signal being generated when the last designated device address matches the ID number stored in the device.

18. The method according to claim 16, wherein the step of setting comprises a step of coupling an input of the output buffer to a static logic level in response to the last device signal.

19. A memory device having a device identification (ID) number for receiving a command packet comprising:
a data flow-through path for receiving the command packet at an input port and for passing the command packet to an output port, the command packet including an op code and code information corresponding to a subset of device ID numbers selected for executing the op code, the code information being generated by performing mathematical operations to logically combine the subset of device ID numbers to generate a mask;
a command interpreter selectively enabled for decoding the op code; and
an ID processor for receiving the code information and decoding the code information, by performing a mathematical operation on the mask and an ID number stored in the memory device, to determine if the mask encodes the ID number stored in the memory device for enabling the command interpreter if the device ID number is encoded in the code information.

20. The memory device of claim 19, wherein the data flow-through path comprises:
an input buffer coupled to the input port for buffering the command packet; and
an output buffer coupled to the input buffer for receiving the command packet and for driving the command packet onto the output port.

21. The memory device of claim 20, wherein the code information includes the mask code and a Target ID number, the ID processor including an ID match decoder for logically combining the mask code, the Target ID number and the device ID for providing a match signal when the device ID number is encoded in the mask code.

22. The memory device according to claim 21, wherein the Target ID number is one of the subset of device ID numbers.

23. The memory device according to claim 21, wherein the ID match decoder comprises
a comparator for comparing each bit of the device ID number with a corresponding bit of the Target ID number to provide a coded Target ID number;
an adder for adding each bit of the mask code to a corresponding bit of the coded Target ID number to provide a modified coded target ID number; and
a multiplier for providing the match signal when all bits of the modified coded target ID number are at an active logic level.

24. The memory device according to claim 23, wherein the comparator includes XNOR logic gates, each XNOR logic gate comparing one bit of the device ID number with a corresponding bit of the Target ID number.

25. The memory device according to claim 23, wherein the adder includes OR logic gates, each OR logic gate adding one bit of the mask code to a corresponding bit of the coded Target ID number.

26. The memory device according to claim 23, wherein the multiplier includes an AND logic circuit for receiving all bits of the modified coded target ID number.

27. The memory device according to claim 21, wherein the ID processor includes an output inhibiting circuit for inhibiting the command packet from being driven onto the output port.

28. The memory device according to claim 27, wherein the output inhibiting circuit comprises:
an adder for adding the mask code to the Target ID number to provide a last device ID number of the subset of device ID numbers; and
a last ID decoder for comparing the device ID number to the last device ID number and for providing a last ID control signal when the device ID number matches the last device ID number.

29. The memory device according to claim 28, wherein the output buffer is disabled in response to the last ID control signal.

30. The memory device according to claim 28, wherein the data flow-through path includes a selector for selectively passing one of the command packet and a null value to the output buffer, the selector passing the null value in response to the last ID control signal.

31. The memory device according to claim 30, wherein the null value corresponds to a bit stored in an output data register coupled to the selector.

32. A memory system comprising:
   a memory controller for issuing a command packet including an op code and code information corresponding to a subset of device identification (ID) numbers selected for executing the op code, the code information being generated by performing mathematical operations to logically combine the subset of device ID numbers to generate a mask; and
   a plurality of serial-connected memory devices in a ring topology with the memory controller, each of the plurality of memory devices having a unique device ID number and receiving the command packet, decoding the code information by performing a mathematical operation on the mask and the unique device ID number, to determine if the mask encodes the unique device ID number and executing the op code if the unique device ID number is encoded in the code information.

33. The memory system of claim 32, wherein each of the plurality of memory devices comprises
   a data flow-through path for receiving the command packet at an input port and for passing the command packet to an output port;
   a command interpreter selectively enabled for decoding the op code; and
   an ID processor for receiving the code information and decoding the code information for enabling the command interpreter when the unique device ID number is encoded in the code information.

34. The memory system of claim 33, wherein the code information comprises the mask code and a Target ID number, the ID processor including an ID match decoder for logically combining the mask code, the Target ID number and the device ID number to provide a match signal when the unique device ID number is encoded in the mask code.

35. The memory system of claim 34, wherein the ID processor comprises an output inhibiting circuit for inhibiting the command packet from being driven onto the output port when the unique device ID number matches a last device ID number of the subset of device ID numbers.

* * * * *